US008632249B2

(12) United States Patent
Iguchi

(10) Patent No.: US 8,632,249 B2
(45) Date of Patent: *Jan. 21, 2014

(54) FREE BALL BEARING, SUPPORT TABLE, CARRYING EQUIPMENT, AND TURNTABLE

(75) Inventor: Kaoru Iguchi, Tokyo (JP)

(73) Assignee: Iguchi Kiko Co., Ltd. (JP)

( * ) Notice: Subject to any disclaimer, the term of this patent is extended or adjusted under 35 U.S.C. 154(b) by 82 days.

This patent is subject to a terminal disclaimer.

(21) Appl. No.: 13/320,178

(22) PCT Filed: May 13, 2010

(86) PCT No.: PCT/JP2010/003244
§ 371 (c)(1),
(2), (4) Date: Nov. 11, 2011

(87) PCT Pub. No.: WO2010/131469
PCT Pub. Date: Nov. 18, 2010

(65) Prior Publication Data
US 2012/0068035 A1  Mar. 22, 2012

(30) Foreign Application Priority Data
May 15, 2009  (JP) .................................. 2009-119285

(51) Int. Cl.
*F16C 29/04*  (2006.01)
(52) U.S. Cl.
USPC ....................................................... 384/49
(58) Field of Classification Search
USPC ............ 384/49; 188/82.1, 82.3, 82.77, 82.84;
193/35 MD; 198/370.09; 108/20, 22,
108/103, 104, 139
See application file for complete search history.

(56) References Cited

U.S. PATENT DOCUMENTS 6,279,716 B1 *  8/2001  Kayatani et al. ......... 193/35 MD
6,786,318 B1 *  9/2004  Pace et al. ................. 193/35 SS (Continued)

FOREIGN PATENT DOCUMENTS

JP          06114661 A     4/1994
JP          06061326 U     8/1994

(Continued)

OTHER PUBLICATIONS

International Search Report and Written Opinion of the International Searching Authority; Application No. PCT/JP2010/003244; Issued: May 27, 2010; Mailed: Jun. 8, 2010; 4 pages.

(Continued)

*Primary Examiner* — Thomas R Hannon
*Assistant Examiner* — Kashif Mohammed
(74) *Attorney, Agent, or Firm* — St. Onge Steward Johnston & Reens LLC

(57) ABSTRACT

A free ball bearing includes a retainer ball-pressing ring, the retainer ball-pressing ring including a substantially cylindrical pressing member inserted in an internal space between the semispherical recessed surface and the main ball toward the base end; the retainer ball-pressing ring being moved from a pressing position to a standby position along the unit center axis by the ring moving mechanism; the pressing member restricting or preventing rotation of the plurality of retainer balls by pressing the plurality of retainer balls when the retainer ball-pressing ring is at the pressing position; and the plurality of retainer balls of which the rotation is restrained or prevented by the pressing member being released when the retainer ball-pressing ring is at the standby position.

16 Claims, 14 Drawing Sheets

(56) References Cited

U.S. PATENT DOCUMENTS

2007/0029158 A1* 2/2007 Iguchi et al. ............ 193/35 MD
2012/0006237 A1* 1/2012 Iguchi .......................... 108/139

FOREIGN PATENT DOCUMENTS

| JP | 2004019876 A | 1/2004 |
| JP | 2004019877 A | 1/2004 |
| JP | 2005322894 A | 11/2005 |
| JP | 2007230722 A | 9/2007 |
| JP | 2008281207 A | 11/2008 |
| TW | 200521349 | 7/2005 |
| TW | 200524799 | 8/2005 |
| TW | I278082 | 4/2007 |

OTHER PUBLICATIONS

Office Action Type: Notice of Allowance Country Code: TW Taiwan Patent Application No: 99115400 Mailing Date: Apr. 24, 2013 5 pages.
International Search Report Application No. PCT/JP2010/002692 Completed: May 18, 2010; Mailing Date: May 25, 2010 2 pages.
Office Action Type: Notice of Allowance Country Code: KR Korean Patent Application No: 10-2011-7027784 Mailing Date: Jul. 18, 2013 4 pages.
Office Action Type: Notice of Allowance Country Code: TW Taiwan Patent Application No: 99111562 Mailing Date: Apr. 29, 2013 4 pages.
US Office Action & Notice of References Cited (PTO-892) U.S. Appl. No. 13/257,028 Issued: May 23, 2013 8 pages.

* cited by examiner

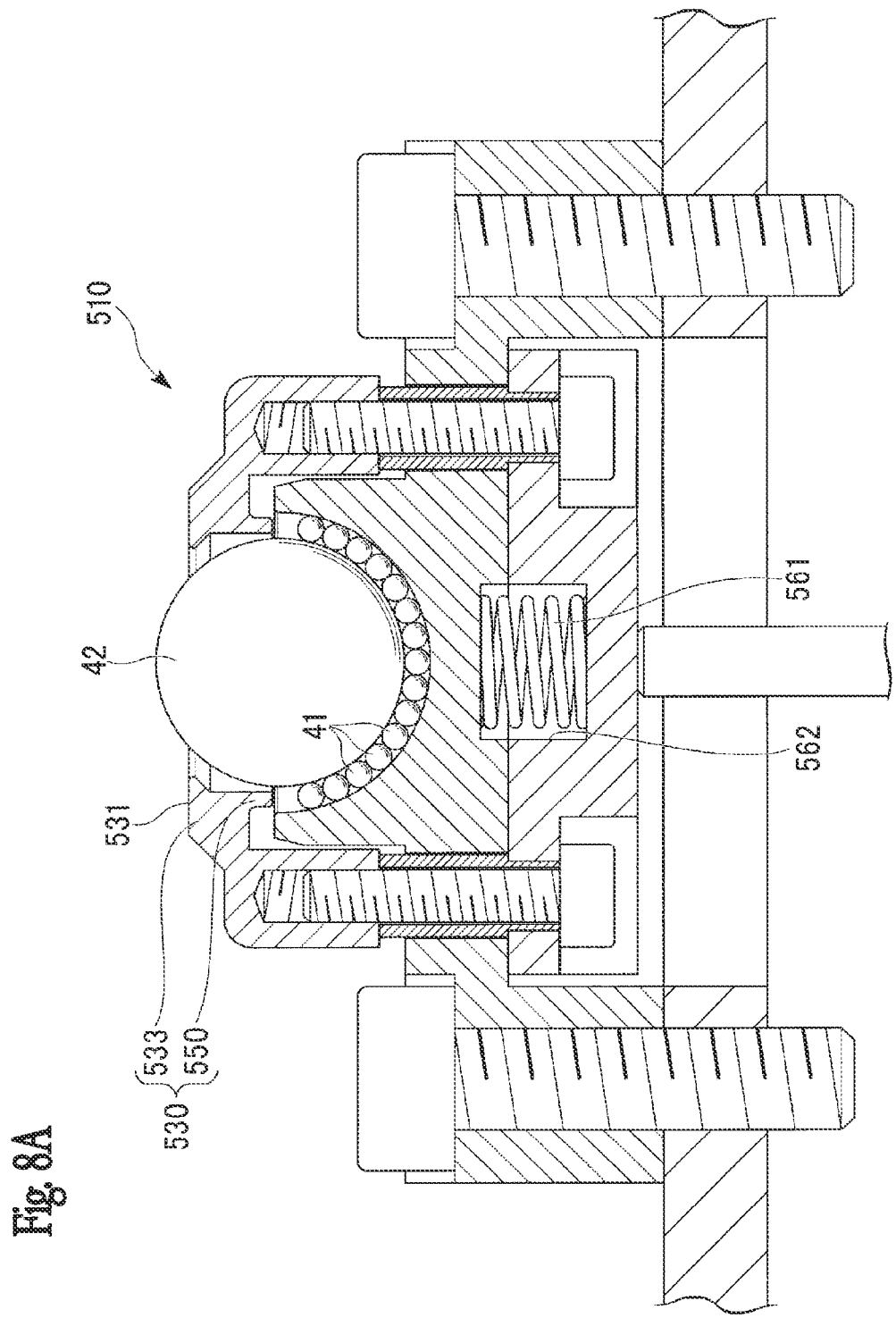

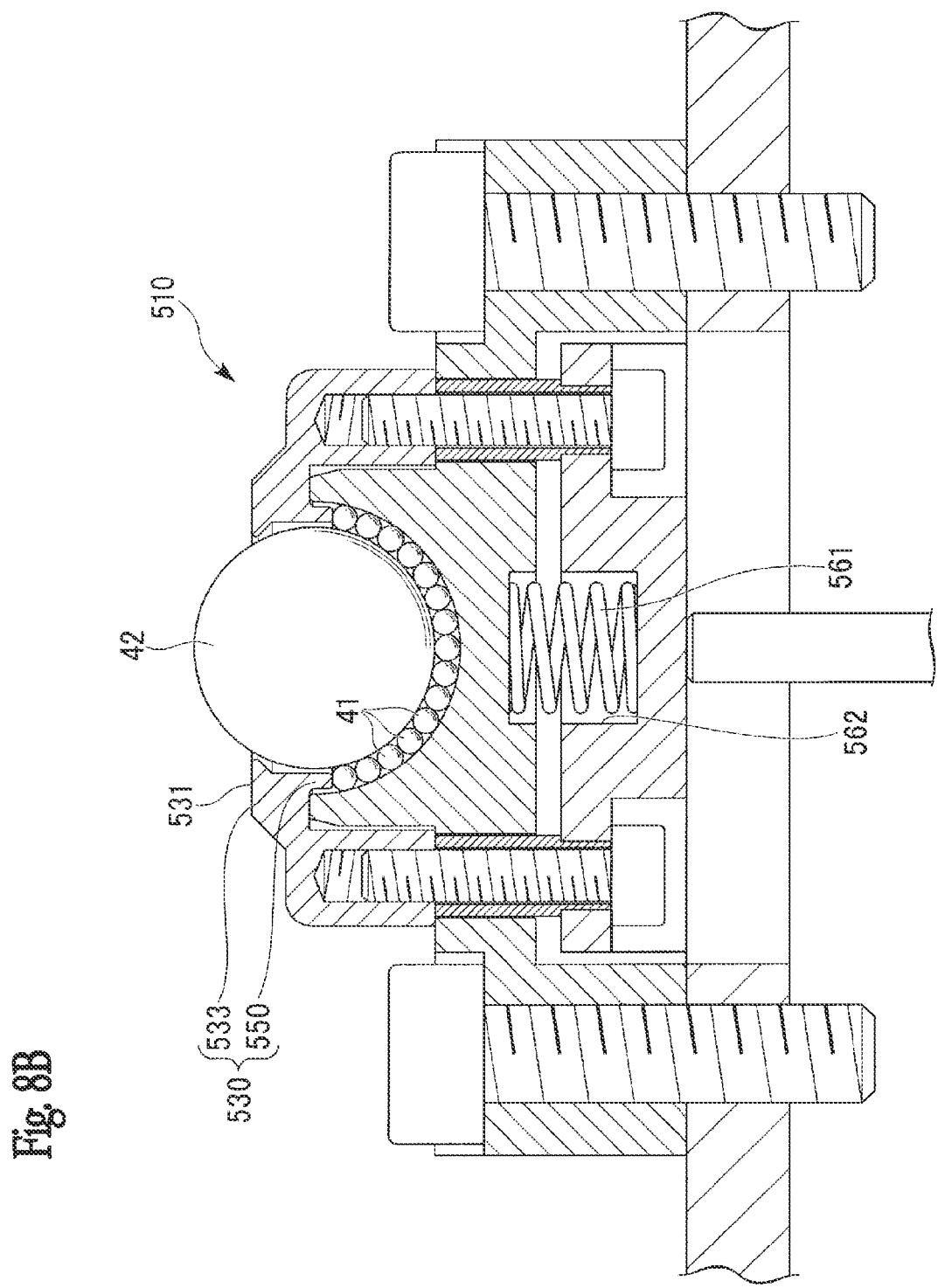

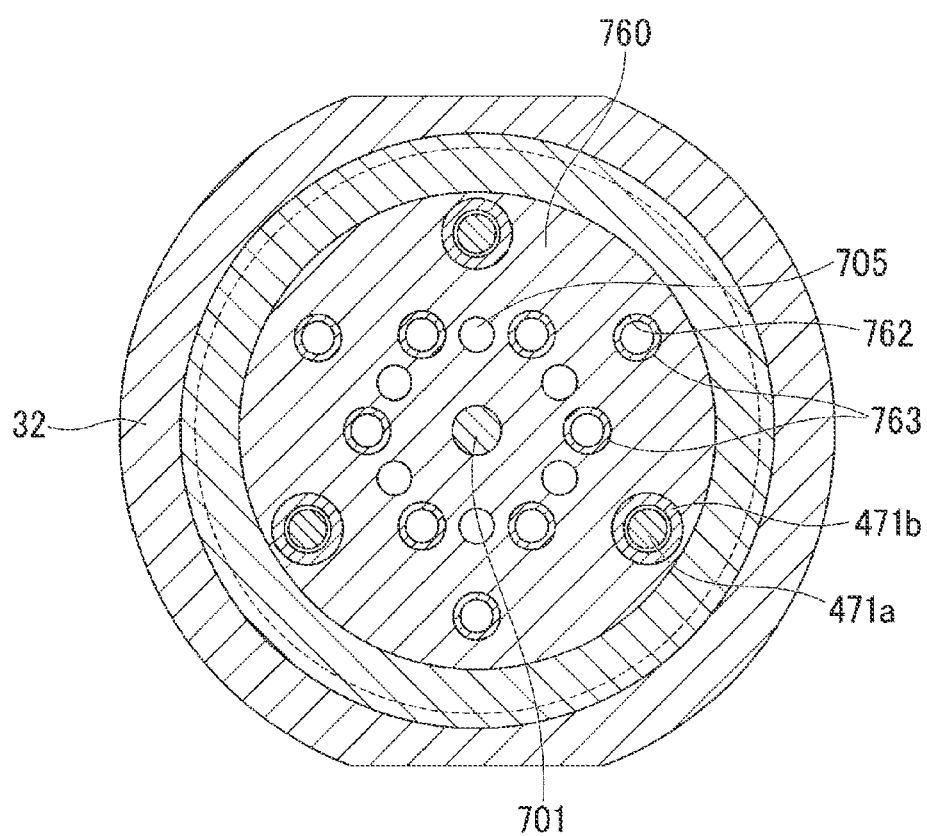

FREE BALL BEARING, SUPPORT TABLE, CARRYING EQUIPMENT, AND TURNTABLE

TECHNICAL FIELD

The present invention relates to a free ball bearing, a support table using the free ball bearing, carrying equipment, and a turntable.

Priority is claimed on Japanese Patent Application No. 2009-119285, filed on May 15, 2009, the content of which is incorporated herein by reference.

BACKGROUND ART

When a carrying table or a locating table which uses a free ball bearing is used, a carried item can be moved or rotated in any horizontal direction and frictional resistance against the carried item is very small. Accordingly, the free ball bearing is employed for a manufacturing process required to reliably prevent damage or secure high accuracy in locating (for example, [Patent Document 1]). For example, in a machining line of a substrate (forming a layer, applying a resistor, exposing, etching and the like), a detailed carried item may be a glass substrate, such as mother glass for display of an FPD /(Flat Panel Display), and a silicon substrate (wafer) for electronic parts, such as a semiconductor device or a semiconductor package.

In this process, a bearing unit of the present invention may be disposed in: a processing room (processing chamber) of a vacuum device that processes a substrate; a vacuum chamber (vacuum room) such as a load-lock chamber disposed to locate a substrate around the inlet of the vacuum device; or a clean room. In this case, the bearing unit can be very useful for carrying, supporting, and locating a workpiece (goods and conveyed item).

The carrying table using the free ball bearing is used for various objects, such as a manufacturing line or a machining line of steel plates, a manufacturing line of architectural materials, and a carrying line of cardboard-packed carried items.

In the carrying equipment, a stopper that hits against the item, a cushion, and a guide member in contact with the item may be provided separately from the free ball bearing to stop or decelerate movement of the item in the middle of carrying. Recently, a configuration disposed in the free ball bearing and that can apply a braking force to the item in the middle of carrying has been proposed (for example, Patent Document 2). Carrying equipment using the free ball bearing has the advantage of not using a stopper, a cushion, or a guide member.

RELATED ART DOCUMENTS

Patent Documents

[Patent Document 1] Japanese Unexamined Patent Application, First Publication No. 2005-322894

[Patent Document 2] Japanese Unexamined Patent Application, First Publication No. 2004-19877

DISCLOSURE OF THE INVENTION

Problems to be Solved by the Invention

A configuration using a rotational suppression member being in contact with a main ball has a problem in that the main ball is worn by friction, and particles due to the friction are scattered in the carriage room, such as a chamber or a clean room. Further, a configuration using grease to reduce movement resistance of members around the main ball has a problem in that the outgas generated from the grease causes contamination of the air in the carrying room.

It is an object of the present invention to provide a bearing unit that can prevent rotation of a main ball without causing contamination of the air in a carrying room, a free ball bearing, a support table, carrying equipment, and a turntable, which use the same, in consideration of the problems.

Means for Solving the Problems

In order to solve the problems, the present invention provides the following configurations.

(1) A free ball bearing unit according to an aspect of the present invention includes: a ball retainer having a semispherical recessed surface; a plurality of retainer balls disposed on the semispherical recessed surface and having the same diameter R1; a main ball rotatably supported by the plurality of retainer balls and having a diameter R2 larger than the diameter R1; a housing that has a shape surrounding the ball retainer, has a circular opening smaller than the diameter R2, and is disposed such that a portion of the main ball protrudes toward the tip end from the base end through the opening; a retainer ball-pressing ring disposed in the housing; and a ring moving mechanism connected to the retainer ball-pressing ring. The retainer ball-pressing ring may include a substantially cylindrical pressing member inserted in an internal space between the semispherical recessed surface and the main ball toward the base end; the retainer ball-pressing ring may be moved by the ring moving mechanism from a pressing position to a standby position along the unit center axis that extends along the protrusion direction of the main ball and passes through the center of the main ball; the pressing member restricts or prevents rotation of the plurality of retainer balls by pressing the plurality of retainer balls when the retainer ball-pressing ring is at the pressing position; and the plurality of retainer balls of which the rotation is restained or prevented by the pressing member is released when the retainer ball-pressing ring is at the standby position.

(2) In the free ball bearing unit of (1), the housing may have an access hole formed from the outside to the inside at the base end, and the ring moving mechanism may include: a spring that moves the retainer ball-pressing ring to the pressing position by elastically biasing the ring moving mechanism toward the base end; an operation part that approaches the access hole of the ring moving mechanism; and the retainer ball-pressing ring may be moved to the standby position by pressing the operation part of the ring moving mechanism toward the tip end.

(3) The free ball bearing unit of (1) or (2) may further include: a base member accommodated at the base end of the housing, has a cylindrical cylinder space therein, and has a through-hole that allows the cylinder space and the inside of the housing to communicate with each other; a movable body disposed to be movable along the unit center axis in the cylinder space; and a connecting member inserted in the through-hole of the base member and connects the retainer ball-pressing ring with the movable body.

(4) In the free ball bearing unit of (3), the spring may apply an elastic bias force to the movable body such that the movable body moves to the base end with respect to the base member and the elastic bias force may be transmitted to the retainer ball-pressing ring through the connecting member.

(5) In the free ball bearing unit of (1), the ring moving mechanism may include: a spring that elastically biases the retainer ball-pressing ring toward the tip end; and a braking member connected to the ring moving mechanism and moves the ring moving mechanism to the pressing position toward the base end.

(6) In the free ball bearing unit (5), the braking member may be an electromagnet that applies a movement force to the retainer ball-pressing ring toward the pressing position.

(7) In the free ball bearing unit of (1), the ring moving mechanism may be a driving device that reciprocates the retainer ball-pressing ring between the pressing position and the standby position, using a driving force of an electric motor.

(8) The free ball bearing unit of (7) further includes a bearing mounting plate that holds the housing, in which the ring moving mechanism may further include a driving force transmitting rod inserted in a mounting plate through-hole formed through the bearing mounting plate, the driving device may rotate the driving force transmitting rod about an axis; and the retainer ball-pressing ring may be moved between the pressing position and the standby position by the rotation of the driving force transmitting rod.

(9) In the free ball bearing unit of (1), the retainer ball-pressing ring may further include: a ring main body that has a cylindrical shape extending in parallel with the unit center axis and is disposed along the outer surface of the ball retainer; and a ring top plate portion that extends inward from the tip end-sided end of the ring main body, and when the pressing member is in contact with the inner end of the ring top plate portion and the retainer ball-pressing ring is at the standby position, the end of the base end of the pressing member may be positioned closer to the base end than the end of the tip of the ball retainer.

(10) In the free ball bearing unit of (1), the retainer ball-pressing ring may further have a ring-shaped expanding portion that protrudes outward from the base end-sided end of the ring main body, and the expanding portion may be in contact with the inner side of the housing from the base end at the standby position.

(11) In the free ball bearing unit of (1), the housing may have a threaded-shaft protruding from the base end and a power supply connection terminal may be formed at the threaded-shaft.

(12) In a support table according to an aspect of the present invention, the free ball bearing unit of (1) or (2) protrudes from a bedplate at a plurality of positions on the bedplate.

(13) Carrying equipment according to an aspect of the present invention, includes the free ball bearing unit according of (1) or (2) and/or the support table of (12).

(14) A turntable according to an aspect of the present invention includes a base member composed of the free ball bearing unit of (1) or (2) and/or the support table of (12); and a rotary table rotatably disposed on the base member.

Effects of Invention

In the free ball bearing of (1), when the retainer ball-pressing ring is moved to the standby position, both rotation of the main body and corresponding circulation of the retainer balls are possible. When the circulation of the retainer balls is restrained or suppressed by disposing the retainer ball-pressing ring at the retainer ball-pressing position to press the retainer balls, rotational resistance against the main ball increases, such that rotation of the main ball is suppressed or the main ball is restricted and does not rotate.

The retainer ball-pressing ring generally controls the rotational resistance against the group of small balls, such that the rotational resistance against the main body is indirectly controlled. In this case, the main ball is not worn and particles due to wear are not scattered. Further, since the control target is the entire group of small balls, a specific small ball does not receive braking resistance or is not worn. Further, since the main balls are not directly controlled, the particles or outgas generated from the grease is not discharged, in the carrying environment, such as the vacuum chamber and the clean room where a workpiece (carried item) is disposed. Therefore, it is possible to suppress contamination of the carrying environment or the workpiece, such as a substrate. Further, since the main balls are not directly braked, the main balls can be braked, with the position accurately maintained.

Further, the contact position between the pressing member and the retainer ball is in the housing. Therefore, particles are not easily scattered.

In the free ball bearing of (2), it is possible to set the degree of suppression applied to the group of small balls by suitably setting the strength of the spring, such that it is possible to suppress rotation of the main ball to a desired degree.

In the free ball bearing of (3), movement of the retainer ball-pressing ring and the movement of the movable body are connected with each other by the connecting member. Therefore, it is possible to easily regulate the motion of the retainer ball-pressing ring by regulating the motion of the movable body. In this case, since the place where particles are generated by physical contact generated in the process of regulating the movable body is far from the opening, it is possible to prevent contamination of the carried items.

In the free ball bearing of (4), the elastic bias force of the spring is exerted in the movable body far from the main ball, such that the elastic bias force is transmitted to the retainer ball-pressing ring. Therefore, the main ball in direct contact with the carried item is not easily contaminated, even though particles are generated by the operation of the spring. Further, it is possible to stably adjust load to the retainer balls by appropriately adjusting the strength of the spring.

In the free ball bearing of (5), since it is possible to adjust the braking force for the retainer balls by operating the braking member from the outside, the degree of freedom of operation is high.

In the free ball bearing of (6), it is possible to adjust the braking force for the retainer balls by controlling the amount of current to the electromagnet, for example. Therefore, the degree of freedom of operation is high, for example, by increasing/decreasing the suppressing force in a plurality of steps, if necessary in the operation.

In the free ball bearing of (7), it is possible to adjust braking and releasing of the retainer balls by controlling the amount of current to the electric motor, for example. Therefore, the degree of freedom of operation is high, for example, by increasing/decreasing the restraining force in a plurality of steps, if necessary in the operation.

In the free ball bearing of (8), the degree of freedom of disposing the driving device is high. Further, since the driving force is applied through the driving force transmitting rod, it is possible to dispose the driving device apart from the opening of the housing. Therefore, particles generated from the driving device are not scattered outside the opening.

In the free ball bearing of (9), since the base end-sided end of the pressing member is held inside the ball retainer even though the retainer ball-pressing ring is at the standby state, the retainer balls are prevented from being scattered.

In the free ball bearing of (10), the standby position can be regulated by contact between the expanding portion and the inner surface of the housing. Since the expanding portion is positioned far from the main ball, the generation of particles due to the contact cannot easily contaminate the main ball.

In the free ball bearing of (11), it is possible to dispose the motor or the electromagnet used to control the retainer balls in the unit.

BRIEF DESCRIPTION OF DRAWINGS

FIG. 8A is a view showing a standby state of a free ball bearing according to a fourth embodiment of the present invention.

FIG. 8B is a view showing a restrained state of the free ball bearing.

FIG. 9C is a cross-sectional view of the free ball bearing, taken along the line A-A.

DESCRIPTION OF EMBODIMENTS

Figure 1:
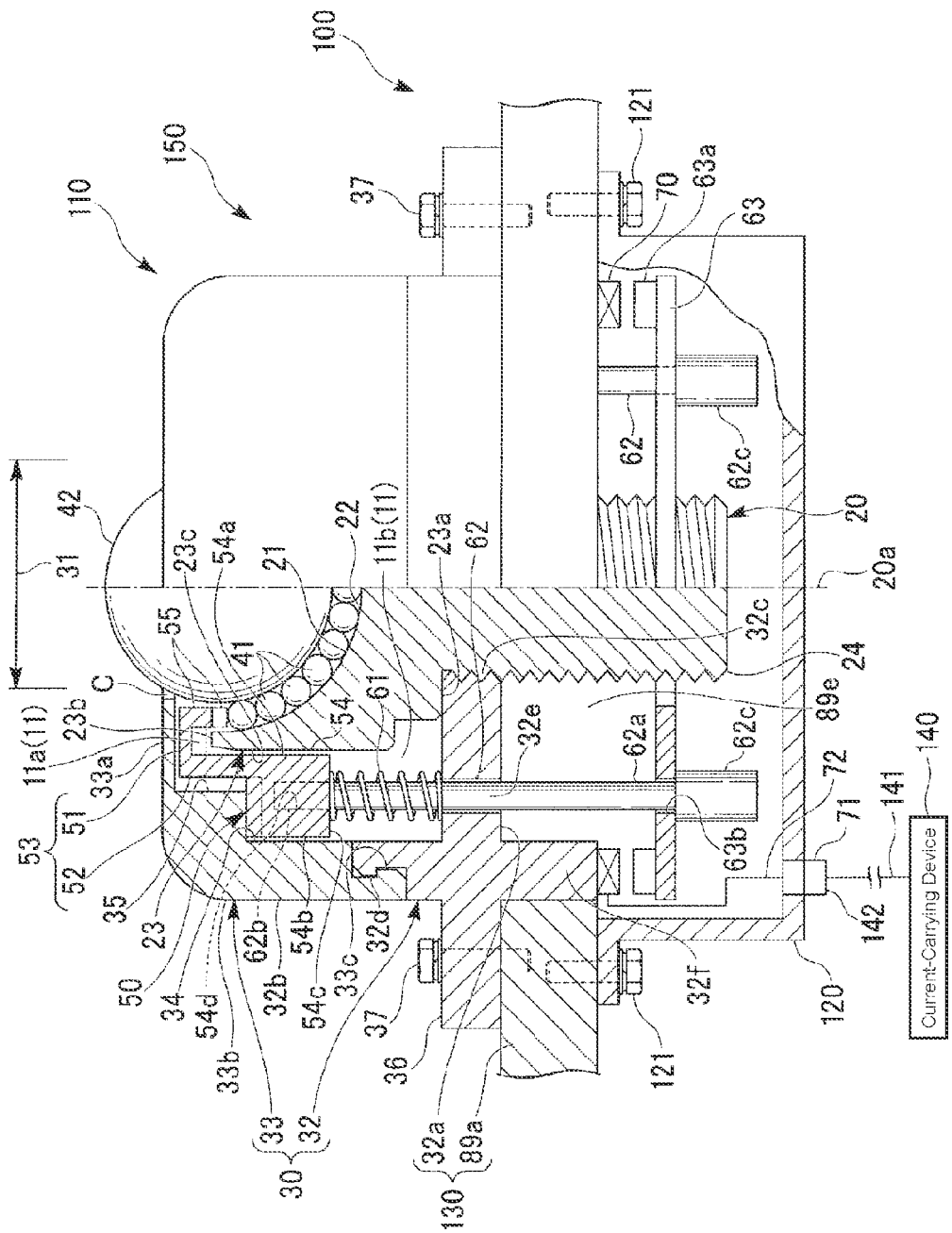
FIG. 1 is a partial cross-sectional view showing the parts around a free ball bearing of a bearing unit according to a first embodiment of the present invention.

Common matters of the embodiments of the present invention are described hereafter.

(Use of Free Ball Bearing and Bearing Unit)

Bearing units according to the embodiments of the present invention include at least a free ball bearing and an operation mechanism that performs a rotation braking operation of the free ball bearing from the outside, with airtightness (pressure difference) maintained.

The bearing unit can be used in a processing chamber for example, for processing a substrate (forming a layer on a glass substrate or a silicon substrate, applying resistor, exposing, etching and the like), or a vacuum chamber (vacuum room, hereafter, briefly referred to as a chamber) such as a load-lock chamber. Further, the bearing unit may be used in a clean room pressurized in an environment to prevent the external air from flowing inside.

For example, a glass substrate, such as mother glass, or a silicon substrate, such as a silicon wafer, may be a workpiece (carried item) handled under the environment. The workpiece brought in the chamber or the clean room is placed on a carrying table for carriage, a support table, or a locating table, and carried. Bearing units according to the embodiments of the present invention, which are described below, can be mounted on the tables.

Other than an airtight room and an atmospheric pressure operation room, the free ball bearings according to the embodiments of the present invention or a carrying table using the free ball bearing can be used in various objects, such as a manufacturing line or a machining line of steel plates, a manufacturing line of architectural materials, and a carrying line of cardboard-packed carried items.

When the free ball bearing is used, for example, in a carrying device, the free ball bearing is mounted on a bearing mounting plate that is a bedplate of the table. In this case, the bearing mounting plate is disposed horizontally or at an angle close to the horizontal. Further, in this case, the free ball bearing is arranged such that the main ball protrudes vertically upward, and the main ball supports the bottom of the workpiece.

As another use, for example, the bearing mounting plate may be disposed vertically or at an angle close to the vertical, as a part of carrying equipment or a part of a workpiece locating device. In this case, the free ball bearing is disposed such that the main ball horizontally protrudes, and the main ball is in contact with a side of the workpiece. A case where the main ball protrudes vertically upward is described below.

Free ball bearings are disposed at a plurality of positions (three or more positions) of the bearing mounting plate such that the main ball protrudes vertically upward. A workpiece is supported on the main ball protruding outside a housing at the tip end of the bearing.

The carrying table and the locating table are considered herein as a kind of 'support table'.

Further, an elevator that can move the whole free ball bearings up/down, with a carried item on the plurality of free ball bearings, may be used.

(Operation of Main Ball and Retainer Ball)

In the free ball bearing according to the embodiment, as the main ball rotates, a plurality of retainer balls rolls along a semispherical recessed surface and the positional relationship of the retainer balls cycles.

That is, when the main ball rotates, the retainer balls being in contact with the main ball accordingly rotate, and roll and move on the semispherical recessed surface. As a result, the retainer balls circulate inside the semispherical recessed surface.

In the following drawings and description, the direction in which the main ball protrudes is defined as the upper part (front end side) and the opposite direction to the protrusion direction of the main ball is defined as the lower part, if not specifically stated. Further, the axis parallel with the protrusion direction of the main ball, through the center of the main ball, is defined as a unit center axis. In the radial direction, the portion close to the center axis of the bearing is defined as the inner portion and the portion far from the center axis is defined as the outer portion.

(First Embodiment)

Hereinafter, a first embodiment of the present invention (a bearing unit 100, a free ball bearing 110, and a support table 89) is described with reference to FIGS. 1 to 5.

Figure 3:
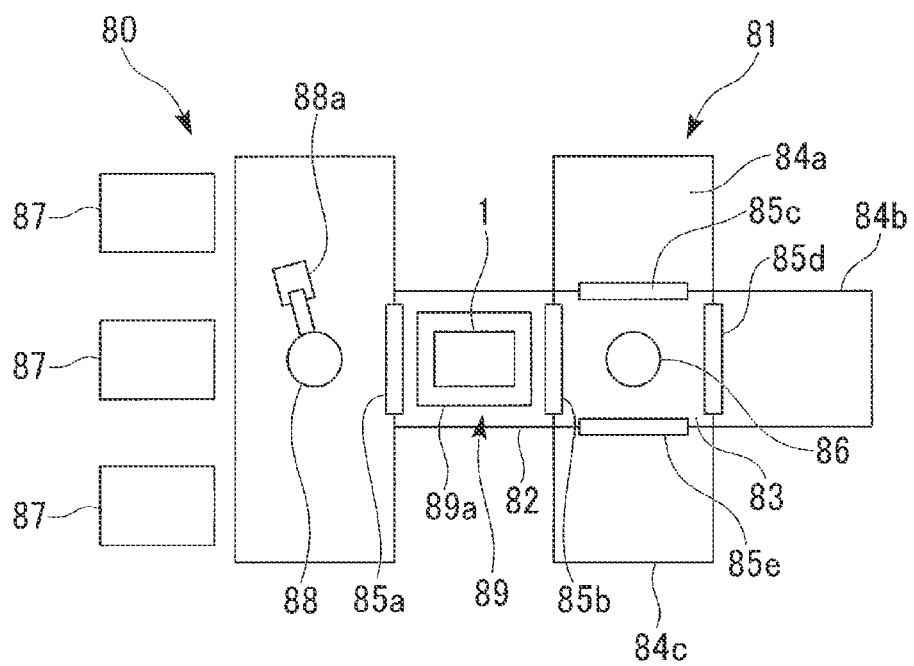
FIG. 3 is a plan view illustrating an example of a vacuum device with the bearing unit of FIG. 1 applied to a substrate locating table.
Figure 4:
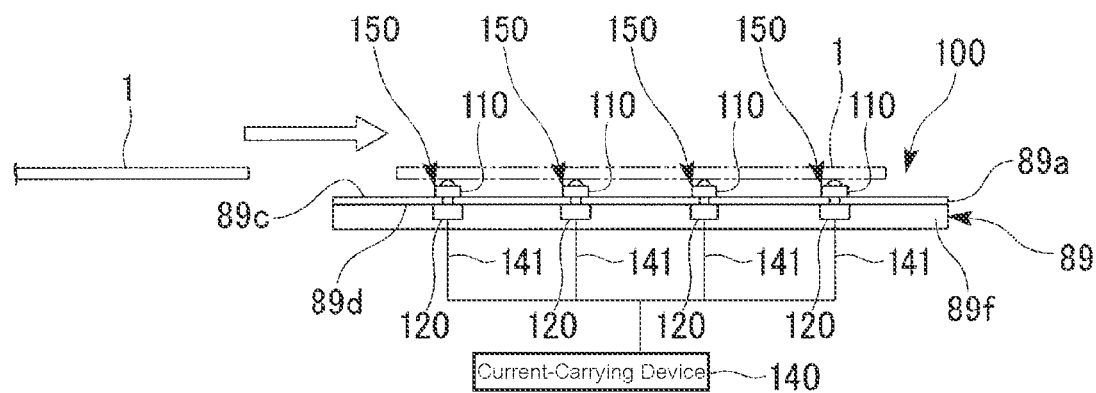
FIG. 4 is a front view illustrating a support table (locating table) of the substrate processing equipment of FIG. 3.
Figure 5:
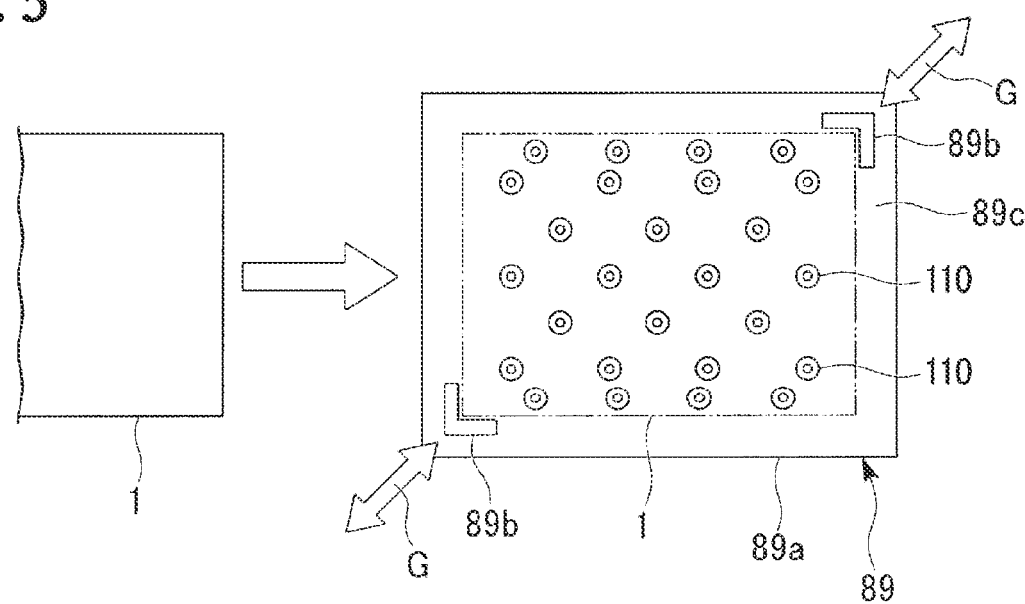
FIG. 5 is a plan view illustrating a support table (locating table) of the substrate processing equipment of FIG. 3.

The bearing unit 100 described herein includes, as shown in FIGS. 3, 4, and 5, a substrate locating table 89 (a support table, hereafter, referred to as a locating table) that accurately locates a substrate 1, such as a mother glass for display or a silicon substrate (wafer). Free ball bearings 110, a driving-for-pressing device 70 (see FIG. 1), and a cover member 120 are disposed on a bedplate 89a of the substrate locating table 89.

The free ball bearings 110 protrude on the bedplate 89a (upward from the bedplate 89a in FIG. 4), at a plurality of positions.

(8) The free ball bearing unit of (7) further includes a bearing mounting plate that holds the housing, in which the ring moving mechanism may further include a driving force transmitting rod inserted in a mounting plate through-hole formed through the bearing mounting plate, the driving device may rotate the driving force transmitting rod about a rod axis, wherein the rod axis is parallel to the unit center axis; and the retainer ball-pressing ring may be moved between the pressing position and the standby position by the rotation of the driving force transmitting rod.

The vacuum device 81 includes a plurality of (three in FIG. 3) processing rooms 84a, 84b, and 84c (processing chambers) for performing processes, such as layering, applying resistor, exposing, and etching, the load-lock chamber 82, and the transfer chamber 83.

Reference numeral '85a' indicates an atmospheric gate disposed in the load-lock chamber 82, reference numeral '85b' indicates a gate (hereafter, referred to as an intermediate gate) that opens/closes the portion between the load-lock chamber 82 and the transfer chamber 83, reference numerals '85c', '85d', and '85e' indicate gates (hereafter, referred to as chamber gates) that open/close the portion between first to third processing rooms 84a, 84b, and 84c and the transfer chamber 83. A robot 86 (a substrate carrying device, hereafter, also referred to as a vacuum robot) that moves the substrate 1 is disposed in the transfer chamber 83. The substrate 1 is carried between the locating table 89 in the load-lock chamber 82 and the processing rooms 84a, 84b, and 84c by the vacuum robot 86.

The load-lock chamber 82, the transfer chamber 83, and the processing rooms 84a, 84b, and 84c correspond to the vacuum room of the embodiment. Further, the entire vacuum device 81 also corresponds to the vacuum room of the embodiment.

The processing equipment 80 includes a cassette 87 and a robot 88 (substrate carrying device, hereafter, also referred to as an atmospheric robot) which are disposed outside the vacuum device 81, and the vacuum device 81.

The atmospheric robot 88 carries, by a movable arm 88 that can move, for example, the substrate 1 in the X-, Y-, and Z-directions. The configuration of the robot 88 is not limited thereto and well-known configurations that are used in vacuum devices may be used. Further, the vacuum robot 86 in the vacuum device 81 may have well-known configurations that are used in vacuum devices.

The atmospheric robot 88 brings the substrate 1 taken out of the cassette 87 into the vacuum device 81 and takes the substrate 1 that has been completely processed in the vacuum device 81 out of the vacuum device 81.

In order to bring the substrate 1 into the vacuum device 81 by the atmospheric robot 88, the atmospheric gate 85a that opens/closes an entrance for the substrate 1 of the vacuum device 81 is opened (with the intermediate gate 85b closed) and the substrate 1 is moved on the locating table 89 in the load-lock chamber 82.

The substrate brought on the bedplate 89a of the locating table 89 is placed and horizontally supported on the main balls 42 (see FIG. 1, described later) protruding upward from free ball bearings 110 that protrude at a plurality of positions on the bedplate 89a. Further, in this status, as shown in FIG. 5, a pair of L-shaped locating members 89b of the locating device disposed on the substrate locating table 89 locate the substrate 1, with the substrate 1 therebetween, in contact with a pair of diagonally opposite corners in the four corners of the rectangular plate-shaped substrate 1.

As indicated by an arrow G in FIG. 5, the pair of locating members 89b are moved by a driving device disposed in a locating device while the distance from each other in the gap direction changes. The pair of locating members 89b move away from each other to positions where the locating members do not interfere with the next carrying operation of the substrate 1, after locating the substrate 1 with both sides therebetween.

Further, the locating device is not limited to the configuration described above, and for example, well-known configurations may be adopted, such as a configuration composed of a first locating device that interposes a substrate between two parallel plates and a second locating device that interposes a substrate between two parallel plates different in orientation at 90 degrees from the first locating device.

The atmospheric robot 88 depressurizes the inside of the load-lock chamber 82 by closing the atmospheric gate 85a after the substrate 1 is placed on the locating table 89. With this configuration, the substrate 1 is located on the locating table 89. Further, after the depressurization is finished, the intermediate gate 85b is opened, and the substrate 1 that has been located on the locating table 89 is brought into any one of the plurality of processing rooms 84a to 84 by the vacuum robot 86 and then processed therein. Further, depressurizing the inside of the load-lock chamber 82 may be started at any timing, before or after locating the substrate 1 on the locating table 89 is finished, or during the locating operation. The intermediate gate 85b is opened only when the substrate 1 is carried between the load-lock chamber 82 and the transfer chamber 83.

Processing of the substrate 1 is performed by bringing the substrate 1 taken out of a processing room into another processing room (or bringing it into the primary processing room), in accordance with the process, such as layering. The substrate 1 is brought into or taken out of the processing room by the vacuum robot 86.

Further, when the substrate 1 taken out of a processing room is brought into another processing room (or into the primary processing room), the substrate 1 taken out of the processing room is once located on the locating table 89 and then brought into another processing room.

When the process is finished, the vacuum robot 86 takes out the substrate 1 from the processing room and places the substrate 1 on the locating table 89 in the load-lock chamber 82. In this operation, the intermediate gate 85b is open and the atmospheric gate 85a is closed. Thereafter, the intermediate gate 85b is closed, the internal pressure of the load-lock chamber 82 increases to the atmospheric pressure, and the substrate 1 is located on the locating table 89. Thereafter, the atmospheric gate 85a is opened and the substrate 1 is taken out of the vacuum device 81 by the atmospheric robot 88.

As shown in FIGS. 4 and 5, the locating table 89 includes the free ball bearings 110 protruding at a plurality of positions on the bedplate 89a. The rotatable main ball 42 protrudes upward from the free ball bearing 110 (see FIG. 1.). The substrate 1 is horizontally supported on the main balls 42. In this case, friction resistance against the substrate is considerably reduced, such that the substrate 1 can be smoothly located by the locating device.

Next, the bearing unit 100 is described.

As shown in FIG. 1, the bearing unit 100 includes: the free ball bearings 110 mounted at a plurality of positions of the bedplate 89a (bearing mounting plate or bearing support member) of the locating table 89; the driving-for-pressing device 70; and the cover member 120. The driving-for-pressing device 70 is disposed on the lower surface 89*d* (rear side) opposite the upper surface 89*c* (surface; the side where the housing 30 of the free ball bearing 110 is disposed through the bedplate 89*a*; upper part in FIG. 1). The driving-for-pressing device 70 moves a driving force transmitting rod 62 such that the driving force transmitting rod 62 further protrudes from the rear side 89*d* of the bedplate 89*a*. The cover member 120 is mounted on the rear side 89*d* of the bedplate 89*a*. The cover member 120 generally covers the portion (rear side end protruding portion 62*a*) of the driving force transmitting rod 62 (described below) which protrudes from the rear side 89*d* of the bedplate 89*a* and the driving-for-pressing device 70.

As shown in FIG. 1, the free ball bearing 110 described herein includes a main body 20, a housing 30, a plurality of retainer balls 41, the main ball 42, a retainer ball-press ring 50, and a spring 61 (returning means).

The main body 20 includes a block-shaped (in detail, cylindrical) ball retainer 23 where a ball-retaining recess 22 that has the semispherical recessed surface 21 as the inner surface is formed and a threaded-shaft 24 that protrudes from an (base end-sided) end opposite an opening of the ball-retaining recess 22 of the ball retainer 23. The housing 30 is disposed to surround the ball retainer 23 of the main body 20. The plurality of retainer balls 41 is disposed on the semispherical recessed surface 21 of the ball retainer 23. The main ball 42 is larger in diameter than the retainer balls 41. The main ball 42 is rotatably supported on the semispherical recessed surface 21 by the retainer balls 41.

The retainer ball-pressing ring 50 can move in the height direction of the bearing (up-down direction in FIG. 1; protrusion direction of the main ball 42), which is the same as the depth direction of the ball-retaining recess 22, in the internal space 11 secured between the ball retainer 23 and the housing 30.

The spring 61 (returning member) is mounted in the housing 30 and elastically biases the retainer ball-pressing ring 50 opposite the base end of the internal space in the height direction of the bearing.

A portion of the main ball 42 protrudes from a main ball protrusion opening 31 formed in the housing 30. The main ball 42 is prevented from falling out by the housing 30. A leaf spring may be used as the spring 61, other than a coil spring.

Further, it is assumed herein that the direction in which a portion of the main ball 42 protrudes from the housing 30 of the free ball bearing 110 is the bearing tip end (the upper side of FIG. 1, and briefly referred to as a tip end) and the side opposite the bearing tip end (the lower side of FIG. 1) is the bearing base end side (briefly referred to as a base end side).

The inner diameter of the main ball protrusion opening 31 of the housing 30 is smaller than the outer diameter of the main ball 42. The inner diameter of the main ball protrusion opening 31 is set such that a clearance C that allows the main ball 42 to freely move is secured between the inner circumference of the main ball protrusion opening 31 and the main ball 42, with the main ball 42 supported by the plurality of retainer balls 41 that are in contact with the semispherical recessed surface 21 of the ball retainer 23, without floating from the retainer balls 41.

The phantom line indicated by reference numeral '20*a*' in FIG. 1 shows the center axial line of the threaded-shaft 24 of the main body 20. The center of the opening of the ball-retaining recess 22 of the main body 20 and the deepest portion of the ball-retaining recess 22 are positioned on the center axial line 20*a*. Further, the center axial line 20*a* shows the axis following the direction in which the main ball protrudes, through the center of the main ball. Hereafter, the center axial line 20*a* is referred to a main body axial line (unit center axis).

In FIG. 1, the free ball bearing 110 is disposed by tightening up the threaded-shaft 24 into the bedplate 89*a* of the substrate locating table 89 such that the opening of the ball-retaining recess 22 is positioned above the ball retainer 23. The main body axial line 20*a* is fixed perpendicular to the bedplate 89*a* (perpendicular to the top 89*c* of the bedplate 89*a*).

However, the free ball bearing 110 may be used, with the opening of the ball-retaining recess 22 positioned above the ball retainer 23 and the main body axial line 20*a* inclined. Further, the free ball bearing may be used, with the height direction of the bearing being the horizontal.

For example, when the free ball bearing is used, with the height direction being the horizontal, the main ball 42 can rotate in all directions while being supported by the retainer balls 41. In this status, rotational resistance against the main ball 42 is small and the main ball can be rotated smoothly by a small force, unless the retainer balls 41 are pressed by the retainer ball-pressing ring 50, which is described later.

In FIG. 1, the main body 20, housing 30, retainer balls 41, main ball 42, and retainer ball-pressing ring 50 of the free ball bearing 110 according to the embodiment may be made of metal or plastic.

Further, the main ball 42 may be made of conductive (conductive in a narrow sense) semi-conductive resin to have a surface resistivity of $10^3$ to $10^{10}$ Ω/square (ohm per square) or a grounding conductive portion in contact with the main ball 42 may be disposed in order to prevent a spark due to static electricity charged in the substrate 1 when the substrate 1 comes in contact with the main ball 42.

For example, the main ball 42 having a surface resistivity of $10^3$ to $10^{10}$ Ω/square described above may be adopted, retainer balls 41 made of conductive metal, such as stainless steel may be used, or the entire main body 20 may be made of conductive metal, such as stainless steel. Alternatively, it may be possible to dispose a contact member (member with a semispherical recessed surface) made of conductive metal that secures electric conductivity in contact with the retainer balls 41 and a grounding wire unit in electrical contact with the contact member, on mother material made of an insulating material, such as plastic. In this case, the retainer balls 41 and the main body 20 are the grounding conductive portions of the free ball bearing. It is possible to prevent a spark from being generated when the main substrate 1 comes in contact with the main ball 42 by contacting the grounding conductive portion with a grounding circuit outside the free ball bearing. Since the generation of a spark causes the substrate 1 to be damaged, it is possible to prevent the substrate 1 to be damaged by the spark by using the free ball bearing 110 having the configuration described above, such that it is possible to improve a product yield ratio.

The retainer balls 41 and the main body 20 may be made of semi-conductive resin.

Further, in the free ball bearing 110 shown in the figures, the threaded-shaft 24 is integrally formed with the main body 20 as a mounting part. Therefore, the threaded-shaft 24 is made of conductive resin or semi-conductive resin, but the threaded-shaft may be individually formed. In this case, the threaded-shaft may be made of conductive metal.

A substance made of a conductive resin mixed with conductive metal filler distributed therein or a substance made of base resin with anti-charging polymer added thereto may be used as the conductive resin material for the main ball 42. The surface resistivity of $10^3$ to $10^{10}$ Ω/square is achieved. The base resin may be POM (polyacetal), PAI (polyamide-imide), PBI (polybenzimidazole), PCTFE (polychloro-trifluoroethylene), PEEK (polyether ether ketone), PEI (polyetherimide), PI (polyimide), PPS (polyphenilensulfide), melamine resin, aromatic polyamide resin(amide resin), or the like. Further, LCP (liquid crystal polymer), PBT (polybutylene terephthalate), PES (polyethersulfone), and other resin may be used. Vespel (wholly aromatic polyimide resin, registered trademark by DuPont) or PBI is suitable for the characteristic stability against the environment in the vacuum device.

The main body 20 or the housing 30, and the retainer ball-pressing ring 50 may be made of the above-described conductive resin materials.

Further, conductive metal, such as stainless steel, may be used for the material of the main ball 42, in accordance with the weight and characteristics of the workpiece (carried item). In particular, when the weight of the workpiece is large, all of the main ball 42, the retainer balls 41, and the main body 20 may be made of stainless steel to increase strength supporting the weight. Further, a configuration in which the main ball 42 is made of stainless steel and the retainer balls 41 and the main body 20 are made of resin may be used, or a configuration in which all of the main ball 42, the retainer balls 41, and the main body 20 are made of resin may be used, in accordance with the requirements, such as the necessary conductivity, weight characteristic, and cost.

Further, the conductive resin is a meaning wider than the insulating resin and includes so-called semi-conductive resin and conductive resin in a narrow sense.

In generally, synthetic resin having a volume resistivity of $10^{13}$ Ωcm may be considered as conductive resin in a wide sense in comparison to the insulating resin. Resin having a volume resistivity of $10^5$ to $10^{13}$ Ωcm can be considered as semi-conductivity resin and resin having a volume resistivity of $10^5$ to $10^{10}$ Ωcm is semi-conductivity resin suitable for controlling electrostatic hazards, which is also called antistatic resin. Therefore, conductive resin (conductive resin-formed product) of the main ball in the free ball bearing of the embodiment may be considered as conductive resin or antistatic resin.

Further, the main body 20, housing 30, retainer balls 41 and main ball 42, and retainer ball-pressing ring 50 of the free ball bearing of the embodiment may be made of material not having conductivity or semi-conductivity (for example, metal or plastic).

As shown in FIG. 1, the threaded-shaft 24 of the main body 20 protrudes from the end surface (bottom 23a) of the base end side of the ball retainer 23 having a block shape (in detail, a cylindrical shape).

In other words, the main body 20 has the ball retainer 23 having an external cylindrical shape larger than the threaded-shaft 24, at one end of the threaded-shaft 24.

The detailed configuration of the housing 30 in the free ball bearing 110 of the example shown in the figures is as follows. The outer circumference of a ring-shaped base end-sided housing member 32 is thread-fastened to the threaded-shaft 24 of the main body 20. A ring-shaped cap 33 with a main ball protrusion opening 31 is fitted on the housing member 32 to be an integral unit.

The base end-sided housing member 32 has a configuration in which a circumferential wall 32b protruding from the surface of one end of a bottom plate 32a is formed on the outer circumference of the ring-shaped bottom plate 32a. Further, the base end-sided housing member 32 is thread-fastened to the outer side of the threaded-shaft 24 by a female threaded-hole 32c formed through the center portion of the bottom plate 32a. The circumferential wall 32b of the base end-sided housing member 32 is disposed to surround the ball retainer 23 of the main body 20. Further, in FIG. 1, the bottom plate 32a of the base end-sided housing member 32 is contact with the bottom 23a of the ball retainer 23.

On the other hand, in the cap 33, a side wall 33b protruding from one end surface of a ring-shaped cover plate portion 33a is formed on the outer circumference of the cover plate portion 33a where the main ball protrusion opening 31 is formed. An engaging protrusion 33c formed on the inner circumference of the side wall 33b is engaged with the base end of an engaging protrusion 32d formed on the outer circumference of the circumferential wall 32b of the base end-sided housing member 32.

The cover plate portion 33a covers the end surface (tip surface 23b) around the opening of the ball-retaining recess 22 of the ball retainer 23 of the main body 20, by being fitted on the base end-sided housing member 32, as described above.

The engaging protrusion 32d of the base end-sided housing 32 and the engaging protrusion 33c of the cap 33 function as coupling portions for integration by fitting (coupling) the cap 33 to the base end-sided housing member 32.

As shown in FIG. 1, the retainer ball-pressing ring 50 is a ring-shaped member, which is fitted around the ball retainer 23 of the main body 20 to be movably received in the height direction of the bearing in an internal space 11 between the ball retainer 23 and the housing 30.

The retainer ball pressure ring 50 includes a main body ring 53, a base end-sided ring portion 54, and a pressing portion 55.

The main body ring 53 has: a ring-shaped top plate portion 51 disposed between the cover plate portion 33a of the cap 33 and the tip surface 23b of the ball retainer 23 (in the tip-sided space 11a of the internal space 11); and a cylindrical portion 52 that protrudes in a rib shape from a side of the ring-shaped top plate portion 51 throughout the outer circumference of the ring-shaped top plate portion 51 and has the bearing base end-sided end disposed in a ring-shaped space 11b that is a portion defined between the outer circumferential surface 23c of the ball retainer 23 and the inner circumferential surface 34 of the housing 30 opposite the outer circumferential surface 23c, in the internal space 11.

The base end-sided ring portion 54 extends from the end at a side of the cylindrical portion 52 of the main body ring 53 (the bearing base end-sided end of the cylindrical portion 52) and is disposed in the ring-shaped space 11b.

The ring-shaped pressing portion 55 protrudes in a rib shape throughout the inner circumferential end of the ring-shaped top plate portion 51 of the main body ring 53 and is inserted between the semi-circular recessed surface 21 of the main body 20 and the main ball 42 to press the retainer ball 41.

The free ball bearing 110 further includes the driving force transmitting rod 62 and a rod driving plate 63.

The driving force transmitting rod 62 (hereafter, briefly referred to as rod) is fixed to the outer circumference of the retainer ball-pressing ring 50 (in detail, the base end-sided ring portion 54) and extends from the retainer ball-pressing ring 50 to the bearing base end.

The rod driving plate 63 is disposed at the portion protruding outside the housing 30 from the bottom plate 32 of the housing 30 of the rod 62.

In the embodiment, the rod 62 and the rod driving plate 63 function as a driving force transmitting member that transmits driving force generated by the driving-for-pressing device 70 to the retainer ball-pressing ring. The rod 62 moves integrally with the retainer ball-pressing ring 50.

The retainer ball-pressing ring 50 with the rod 62 mounted is referred to as a driving rod-mounted press ring hereafter.

In the driving rod-mounted press ring shown in the example shown in the figure, a female threaded-hole 54*d* is formed through the base-sided ring portion 54 of the retainer ball-pressing ring 50 to be open at the end surface 54*c* of the base side.

The rod 62 is fixed to the retainer ball-pressing ring 50 by tightening up a male threaded-portion 62*b* at one end of the rod 62 in the female threaded-hole 54*d*.

The rod 62 can be separated from the base-sided ring portion 54 by being turned in the opposite direction to the direction for tightening-up in the female threaded-hole 54*d*.

As the rod 62, a configuration in which a retaining portion 62*c* (described below) disposed at the other end of the rod 62 and protruding in a flange shape from the outer circumference of the rod 62 is a thicker portion of the rod 62 and a configuration in which the retaining portion 62*c* is thread-fastened and fixed to the portion (bar-shaped rod main body), except for the retaining portion 62*c* of the rod 62 may be used, in order to prevent the rod driving plate 63 from falling out.

In the configuration of the latter, a configuration for fixing the rod 62 (rod main body) to the retainer ball-pressing ring 50 is not limited to the thread-fastening, and for example, embedding and fixing one end of the rod 62 made of metal in the base end-sided ring portion 54 when making resin of the retainer ball-pressing ring 50 made of synthetic resin (insert mold forming) or welding the rod 62 made of metal to the base end-sided ring portion 54 of the retainer ball-pressing ring 50 made of metal may be used.

In FIG. 1, the free ball bearing 110 is sealed and fixed to the bedplate 89*a*, with the flange portion 36, which protrudes from the outer circumference of the outer circumferential wall forming the inner circumferential surface 34 of the housing 30 (in detail, the outer circumference 32*b* of the circumferential wall of the base end-sided housing 32), being in contact with the upper surface 89*c* of the bedplate 89*a*. The bottom plate 32*a* of the housing 32 is aligned in a through-hole (hereafter, mounting plate through-hole 89*e*) formed in a size corresponding to the bottom plate 32*a*, in the bedplate 89*a*. Reference numeral 37 in the figure indicates a screw for fixing the flange portion 36 to the bed plate 89*e*.

In the free ball bearing 110 of the example shown in the figure, the flange portion 36 of the housing 32 is a protruding portion formed by extending the bottom plate 32*a* outward from the circumferential wall 32*b* of the base end-sided housing member 32.

However, it is not limited to the configuration, and for example, a configuration in which the flange portion 36 is positioned closer to the bearing tip than the bottom plate 32*a* and the free ball bearing 110 is mounted on the bedplate 89*a* by inserting the portion positioned at a side of the bearing base end into the mounting plate through-hole 89*e* of the bedplate 89*a* from the flange portion 36 in the housing 30 may be used.

Further, sealing-fixing of the housing 32 to the bedplate 89*a* is implemented as described below. In the bedplate 89*a*, the housing 32 (the flange portion 36 in the embodiment) is fixed to the portion positioned around the mounting plate through-hole 89*e*, such that the periphery of the mounting plate through-hole 89*e* is sealed. Therefore, it is possible to prevent particles generated by contact (described below) between the rod driving plate 63 and the rod 62 from being scattered to the surface of a composite wall 130 through between the bedplate 89*a* and the housing 32 from the space inside the cover member 120 (a receiving space that receives the driving-for-pressing device 70 and the rear-sided protrusion 62*a* of the driving force transmitting rod 62), at the rear side opposite the surface where the tip of the bearing of the free ball bearing 110 of the composite wall 130 composed of the bottom plate 32*a* and the bedplate 89*a*.

Further, grease is not used to sealing-fix the housing 32 to the bedplate 89*a*, such that the inside of the chamber (the load-lock chamber 82 herein) is not contaminated by the outgas generated from the grease. Further, although an O-ring (not shown) may be used, if necessary, the O-ring is preferably made of metal, rather than rubber.

The cover member 120 is formed in a container shape that receives the rear-sided protrusion 62*a* of the driving force transmitting rod 62 and the driving-for-pressing device 70. The rim of the cover member 120 is sealing-fixed to the rear side 89*d* of the bedplate 89*a* (by an O-ring (not shown) or the like, if necessary). In the cover member 120, the rim is sealing-fixed to a portion positioned around the mounting plate through-hole 89*e* of the bedplate 89*a* and covers the driving-for-pressing device 70 and the rear-sided protrusion 62*a* of the driving force transmitting rod 62. The driving-for-pressing device 70 and the rear-sided protrusion 62*a* of the driving force transmitting rod 62 are received in the receiving space at the inside surrounded by the cover member 120 and the composite wall 130.

Reference numeral '121' in the figure indicates a screw that fixes the flange portion protruding from the outer circumference of the rim of the cover member 120 to the bedplate 89*a*.

Further, grease is not used to sealing-fix cover member 120 to the bedplate 89*a*, such that the inside of the chamber (the load-lock chamber 82 herein) is not contaminated by the outgas generated from the grease. Further, the O-ring is preferably made of metal, rather than rubber.

The rod 62 passes through the bottom plate through-hole 32*e* formed in the bottom plate 32*a* of the housing 32, and the other end (base end) opposite one end (tip) fixed to the retainer ball-pressing ring 50 protrudes from the rear side opposite the surface where the bearing tip end of the free ball bearing 110 of the composite wall 130 composed of the bottom plate 32*a* and the bedplate 89*a* protrudes.

The bottom plate through-hole 32*e* is slightly larger in cross-sectional size (the size of the cross-section perpendicular to the center axial line) than the rod 62 in order to secure a clearance between the inner circumferential surface and the outer circumferential surface of the rod 62. It is preferable that the cross-sectional size not be too large. The bottom plate through-hole 32*e* may be, for example, a ring-shaped hole having an inner diameter slightly larger than the outer diameter of the rod 62.

When the cross-section of the bottom plate through-hole 32*e* is sized such that a clearance can be ensured between the inner circumferential surface thereof and the outer circumferential surface of the rod 62, it is possible to restrain or prevent generation of particles due to the contact between the inner surface of the bottom plate through-hole 32*e* and the rod 62. Further, when the cross-sectional size of the bottom through-hole 32*e* is limited under a too large size, the particles generated from the contact portion of the rod driving plate 63 and the rod 62 at the rear side of the composite wall 130 do not easily move to the internal space 11 (in detail, the ring-shaped space 11*b*) of the free ball bearing 110. As a result, it is possible to restrain the particles from being scattered (reduce the scattered amount) from the main ball protrusion opening 31 of the housing 30.

The driving-for-pressing device 70 is disposed on the rear side of the composite wall 130. Accordingly, a movement force can be applied to the rear-sided protrusion 62*a* that is the portion protruding from the rear side of the composite wall 130 of the bedplate 89a of the rod 62 such that the protrusion size of the rod 62 at the rear side of the composite wall 130 increases.

The driving-for-pressing device 70 of the bearing unit 100 exemplified in FIG. 1 is, in detail, an electromagnet, and the driving-for-pressing device is referred to as an electromagnet hereafter.

The electromagnet 70 is fixed to a rear-sided protrusion 32f which protrudes in a ring shape from the outer surface (rear side, bearing base end, and opposite the internal space 11) around the outside of the bottom plate 32 of the housing 30 of the free ball housing 110 and is inserted in the mounting plate through-hole 89e, such that the electromagnet 70 is disposed in the rear side of the composite wall 130.

The electromagnet 70 is electrically connected to a current-carrying device 140 disposed apart from the bearing unit 100. As current is carried by the current-carrying device 140, a magnetic repelling force is generated between the electromagnet 70 and a permanent magnet 63a fixed to the rod driving plate 63 disposed on the rear-sided protrusion 62a of the rod 62, such that a movement force is applied to the rod 62 such that the size of protrusion from the composite wall 130 to the rear side increases.

Further, a space (receiving space) sized such that the rod 62 and the rod driving plate 63 can move is ensured in the cover member 120.

The rod 62 is uniformly mounted at three or more positions (in detail, four positions, see FIG. 2) in the circumferential direction of the outer circumference of the retainer ball-pressing ring 50, in parallel with each other.

Figure 2:
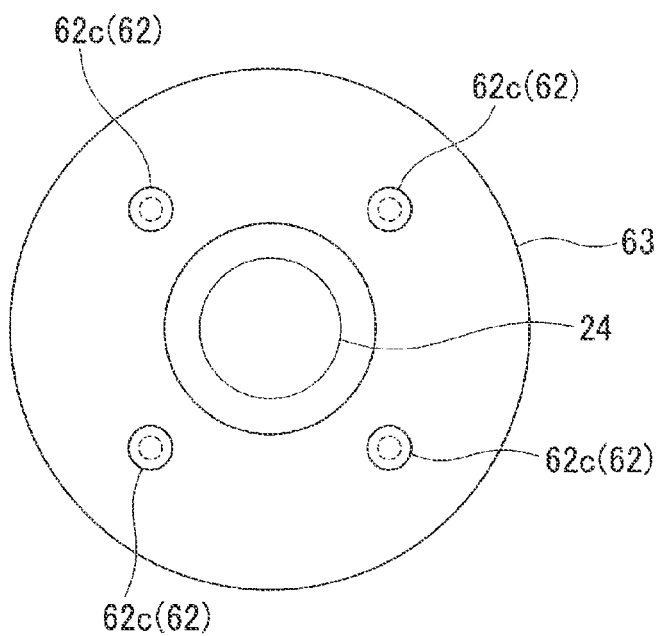
FIG. 2 is an enlarged cross-sectional view showing the parts around the driving-for-pressing device of the bearing unit of FIG. 1.

As shown in FIG. 2, each of the rods 62 is inserted in a rod through-hole 63b, which is a through-hole, formed through the rod driving plate 63. The rod driving plate 63 is guided by the plurality of rods 62 of the driving rod-mounted press ring and can move in the height direction of the bearing between the electromagnet 70 and the retaining portion 62c protruding and expanding than the outer circumference of the rod 62 at the base end (the lower end in FIG. 1) of the rod 62.

Further, in the bearing unit 100, when current is carried to the electromagnet 70, the rod driving plate 63 presses the retaining portions 62c of the rod 62c by the magnetic repelling force. Therefore, a movement force is applied to the rod 62 such that the size of protrusion from the composite wall 130 to the rear side increases.

A magnet driving plate is implemented by mounting the permanent magnet 63a on the rod driving plate 63. The plate is disposed opposite to the composite wall 130 through the electromagnet 70, and when the magnetic repelling force is applied by the current flowing to the electromagnet 70, a movement force is applied such that the distance from the composite wall 130 increases. Therefore, a movement force is applied to the rod 62 such that the size of protrusion from the composite wall 130 to the rear side increases. The movement force can be applied to the plurality of rods 62c from one rod driving plate 63. Therefore, the movement force toward the bearing base end can be applied to the retainer ball-pressing ring 50. Accordingly, it is possible to dispose the retainer ball-pressing ring 50 at a retainer ball press position (the position of the retainer ball-pressing ring 50 indicated by a phantom line in FIG. 1) where the retainer balls 41 are pressed by a pressing member 55.

When the movement force toward the bearing base end is not applied to the retainer ball-pressing ring 50 by the driving-for-pressing device 70 (when current does not flow in the electromagnet 70), as indicated by the solid line in FIG. 1, the retainer ball-pressing ring 50 of the free ball bearing 110 is disposed at a position (standby position) where the press member 55 spaces the retainer balls 41 in the ball retainer 23 to the cover plate portion 33a of the cap 33 (the open end of the internal space 11) from the retainer ball press position by the elasticity of the spring 61.

In the free ball bearing 110 exemplified in the figure, a contact surface 56 (end surface of the main body ring side of the base end-sided ring portion 54) is formed at a stepped portion between the main body ring 53 of the retainer ball-pressing ring 50 and base end-sided ring portion 54 slightly deviating from the outer circumference with respect to the main body ring 53. The position where the contact surface 56 is in contact with the protruding wall 35 that expands from the inner circumference of the side wall 33b of the cap 33 from the base end of the internal space 11 due to the elasticity of the spring 61 is the standby position of the retainer ball-pressing ring 50.

When the retainer ball-pressing ring 50 is at the standby position, the ring-shaped top plate portion 51 is not in contact with the cover plate portion 33a of the cap 33, such that a small gap is ensured between the cover plate portion 33a of the cap 33 and the ring-shaped top plate portion 51. According to the configuration, when the retainer ball-pressing ring 50 is returned to the standby position from the retainer ball press position by the elasticity of the spring 61, particles due to contact between the cover plate portion 33a of the cap 33 and the ring-shaped top plate portion 51 are not generated, which effectively contributes to restrain generation of particles in the free ball bearing and restrain the scattering amount of particles generated in the free ball bearing into the vacuum room (the load-lock chamber herein).

The inner diameter of the base end-side ring portion 54 of the retainer ball-pressing ring 50 is set slightly larger than the outer diameter of the ball retainer 23 (diameter of the outer circumferential surface 23c of the cylindrical shape) such that a small clearance can be ensured between the inner circumferential surface 54a of the base end-side ring portion 54 and the outer circumferential surface 23c of the ball retainer 23. Further, the outer diameter of the base end-sided ring portion 54 is set slightly smaller than the inner diameter of the outer circumferential wall of the housing 30 (in detail, the inner diameter of the other portion than the protruding wall 35 of the side wall 33b of the cap 33; further, the inner circumferential surface 34 of the housing 30 does not include the position where the protruding wall 35 is formed) such that a small clearance can be ensured between the outer circumferential surface 54b of the base end-sided ring portion 54 and the inner circumferential surface 34 of the housing 30.

The difference between the inner diameter of the base end-sided ring portion 54 and the outer diameter of the ball retainer 23 and the difference between the outer diameter of the base end-side ring portion 54 and the inner diameter of the outer circumferential wall of the housing 30 may be the same. In the embodiment, the difference between the outer diameter of the base end-side ring portion 54 and the inner diameter of the outer circumferential wall of the housing 30 is larger than the difference between the inner diameter of the base end-sided ring portion 54 and the outer diameter of the ball retainer 23. In this case, the base end-sided ring portion 54 does not come in contact with the inner circumferential surface 34 of the housing 30, even if the retainer ball-pressing ring 50 oscillates in the range of the clearance between the inner circumferential surface 54a of the base end-sided ring portion 54 and the outer circumferential surface 23c of the ball retainer 23.

According to the configuration, when the retainer ball-pressing ring 50 moves in the height direction of the bearing, it is possible to restrain contact of the base end-sided ring portion 54 to the ball retainer 23 in the small amount. Therefore, it is preferable in terms of restraining generation of particles, as compared with, for example, a configuration in which the inner circumferential surface 54a of the base end-sided ring portion 54 slides in surface contact with the outer circumferential surface 23c of the ball retainer 23.

A configuration in which the difference between the outer diameter of the base end-side ring portion 54 and the inner diameter of the outer circumferential wall of the housing 30 is smaller than the difference between the inner diameter of the base end-sided ring portion 54 and the outer diameter of the ball retainer 23 may be used.

Further, in the embodiment, at least one of the difference (inner-outer diameter difference) between the inner diameter of the base end-sided ring portion 54 and the outer diameter of the ball retainer 23 and the difference (inner-outer diameter difference) between the outer diameter of the base end-side ring portion 54 and the inner diameter of the outer circumferential wall of the housing 30 is set in the range where the retainer ball-pressing ring 50 is allowed to slightly move (finely move) perpendicular to the bearing height direction with respect to the ball retainer 23 and the retainer ball-pressing ring 50 does not move at a large angle. As described above, since the inner-outer diameter difference is made small, the particles generated from the contact portion between the rod driving plate 63 and the rod 62 at the rear side of the composite wall 130 have difficulty in moving from the ring-shaped space 11b in the free ball bearing 110 to the tip-sided space 11a. By this configuration, it is possible to restrain the particles from being scattered (reduce the scattered amount) from the main ball protrusion opening 31 of the housing 30.

Grease for lubrication that reduces movement resistance against the retainer ball-pressing ring 50 is not disposed between the base end-sided ring portion 54 and the outer circumferential surface 23c of the ball retainer 23 and between the base end-sided ring portion 54 and the inner circumferential surface 34 of the housing 30. This is for avoiding contamination of the inside of the chamber due to the outgas discharged from the grease.

With the retainer ball-pressing ring 50 at the standby position shown in FIG. 1, when the movement force toward the bearing base end from the driving-for-pressing device 70 through the rod 62 is exerted in the retainer ball-pressing ring 50, as indicated by the phantom line in FIG. 1, the retainer ball-pressing ring 50 moves to the retainer ball press position from the standby position. In this process, the pressing member 55 of the retainer ball-pressing ring 50 presses the retainer balls 41 in the ball retainer 23. As a result, rotation of the retainer balls 41 in the ball retainer 23 is restrained. Consequently, rotational resistance against the main ball 42 increases, as compared with when the movement force is not applied to the base end of the internal space 11.

As shown in FIG. 1, the outer diameter of the press member 55 of the retainer ball-pressing ring 50 is slightly smaller than the inner diameter of the opening of the ball-retaining recess 22. When the retainer ball-pressing ring 50 is at the retainer ball press position, the press member 55 is not in contact with the semispherical recessed surface 21 of the ball-retaining recess 22. Further, when the retainer ball-pressing ring 50 is at the retainer ball press position, the press member 55 is also not in contact with the main ball 42. Further, in this state, the ring-shaped top plate portion 51 of the retainer ball-pressing ring 50 is not in contact with the ball retainer 23 (in detail, the tip surface 23b).

The retainer ball-pressing ring 50 can oscillate in the range of the clearance between the inner circumferential surface 54a of the base end-sided ring portion 54 and the outer circumferential surface 23c of the ball retainer 23.

The size of the clearance, that is, the difference between the inner diameter of the base end-sided ring portion 54 and the outer diameter 23 of the ball retainer 23 is set such that the press member 55 is not in contact with the semispherical recessed surface 21 of the ball-retaining recess 22 and also with the main ball 42, when the retainer ball-pressing ring 50 is at the retainer ball press position.

According to this configuration, contact between the press member 55 and the ball retainer 23, contact between the press member 55 and the main ball 42, and contact between the ring-shaped top plate 51 and the ball retainer 23 are not generated, such that particles are not generated. Therefore, this effectively contributes to restraining scattering of particles (reducing the scattering amount) from the main ball protrusion opening 31 to the outside of the housing 30.

Further, the difference between the inner diameter of the base end-sided ring portion 54 of the retainer ball-pressing ring 50 and the outer diameter of the ball retainer 23 is set such that contact between the press member 55 and the ball retainer 23 or contact between the press member 55 and the main ball 42 is not generated, even though the retainer ball-pressing ring 50 is at the standby position.

The press member 55 is inserted in between the semispherical recessed surface 21 and the main ball 42 from the opening of the ball-retaining recess 22 of the ball retainer 23 and presses the retainer balls 41. Therefore, the position where the press member 55 presses the retainer ball 41 (retainer ball press position) is a position of the bottom side of the ball-retaining recess 22 from the opening of the ball-retaining recess 22. Further, since the press member 55 almost blocks the portion between the inner surface around the opening of the ball-retaining recess 22 and the main ball 42, the particles generated by contact between the press member 55 and the retainer balls 41 at the retainer ball press position are not easily scattered from the ball-retaining recess 22.

Further, in the embodiment, when the retainer ball-pressing ring 50 is at the standby position, the press member 55 is disposed at a position where it can prevent the retainer balls 41 from protruding from the ball-retaining recess 22. Therefore, even though the retainer ball-pressing ring 50 is at the standby position, the press member 55 is kept almost blocking the portion between the inner surface around the opening of the ball-retaining recess 22 and the main ball 42. The press member 55 prevents the particles from being scattered from the ball-retaining recess 22.

In the bearing unit 100 of FIG. 4, the locating table 89 includes bearing assembly units 150 at a plurality of positions (several positions) of the bedplate 89a. The bearing assembly unit 150 includes the free ball bearing 110, the driving-for-pressing device 70, and the cover member 120. The bearing unit 100 is disposed on leg members 89f supporting the bedplate 89a.

Further, the locating table 89 locates the substrate 1 by the locating device, with the substrate 1, which has been placed on the bearing unit 100, supported on the main ball 42 protruding from the bearing tip (upper end) of the free ball bearing 110 of the bearing assembly unit 150.

Further, the bearing assembly unit 150 can function by itself as the bearing unit according to the embodiment.

Further, the bearing unit 100 can function as the support table according to the embodiment by itself.

In the locating table 89 shown in FIG. 4, the driving-for-pressing devices 70 (see FIG. 1 for the driving-for-pressing device 70) of the bearing assembly units 150 of the bearing unit 100 are electrically connected to one current-carrying device 140. All of the bearing assembly units 150 can be simultaneously driven by one current-carrying device 140. That is, the movement of the retainer ball-pressing ring 50 from the standby position to the retainer ball press position by applying current to the driving-for-pressing device 70 (see FIG. 1) and returning of the retainer ball-pressing ring 50 to the standby position (returning by the elasticity of the spring 61) by stopping the current are simultaneously performed in synchronization by one current-carrying device 140.

As shown in FIG. 1, in the bearing unit 100 (bearing assembly unit 150) exemplified in the figure, a power supply connection terminal 71 that connects an external power supply electric circuit 141 (external electric circuit of the cover member 120) to the electromagnet 70 is disposed on the outer surface of the cover member 120. The power supply connection terminal 71 is electrically connected to the electromagnet 70 through a conductive circuit 72 disposed inside the cover member 120. Further, reference numeral '142' in FIG. 1 indicates a connector disposed at the terminal of the external electric circuit 141 to separately connect the external electric circuit 141 to the power supply connection terminal 71.

According to this configuration, it is easy to ensure sealability of the cover member 120 and it is preferable in terms of preventing particles which are generated inside the cover member 120 from being scattered at the rear side of the composite wall 130, as compared with a configuration in which the conductive device 140 disposed outside of the vacuum room is connected to the electromagnet 70 through a power supply line passing through the cover member 120.

Further, it may be possible to use a metal spiral wire, or a metal member made of conductive metal in a bar shape or a plate shape (for example, the member of the substrate locating table 89) as the external electric circuit 141 to prevent generation of outgas in the vacuum room. Further, it may also be possible to use a configuration using a housing, for example, made of ceramics or a configuration using a housing made of plastic generating a small amount of gas, as the connector 142. Further, it may be possible to directly and electrically connect the external electric circuit 141 using a metal spiral wire or a member made of conductive metal to the power supply connection terminal 71 of the cover member 120 by soldering, without using the connector 142.

As the conductive circuit 72 in the cover member 120, it is preferable in terms of restraining (or reducing) the generation of outgas to use, for example, a metal spiral wire, or a metal member made of conductive metal in a bar shape or a plate shape.

As shown in FIGS. 4 and 5, in the substrate locating table 89, the substrate 1 is carried on the bedplate 89a, with the retainer ball-pressing ring 50 of the free ball bearing 110 at the standby position. Further, the substrate 1 is located by the pair of L-shaped locating members 89b of the locating device. That is, the substrate 1 is interposed between the pair of locating members 89b. Thereafter, the retainer balls 41 are pressed by the retainer ball-pressing ring 50 by driving the driving-for-pressing device 70 that is disposed, corresponding to the free ball bearing 110 (applying current to the electromagnet 70), thereby restraining rotation of the retainer balls 41 and the main ball 42. Thereafter, the substrate 1 interposed between the pair of locating members 89b of the locating device is released.

The substrate 1 is carried from the locating table 89 by the vacuum robot 86 (see FIG. 3) or the atmospheric robot 88, after the substrate 1 interposed between the pair of locating member 89b is released.

The substrate 1 may be finely warped (shaken), when the substrate 1 (particularly, a large-sized substrate, for example, a seventh generation size (1870×2200 mm) or a larger glass substrate for FPD) is placed on the bedplate 89a. The warping (shaking) may not be removed in many cases, even if the substrate is located while being interposed between a plurality of locating members 89b. Further, with the warping (shaking) remaining, when the substrate 1 is released by spacing the locating members, slight positional deviation may be generated by the influence of the warping (shaking). When the positional deviation of the substrate 1 on the substrate locating table 89 is large and is not removed even after the substrate 1 is carried in the processing room by a substrate carrying device in the vacuum device 81 (vacuum device-in-processing room), such as the vacuum robot 86 (see FIG. 3), the process performed in the processing room is also influenced. Therefore, it is advantageous in terms of ensuring process accuracy of machining of the substrate 1 to reduce or remove the positional deviation of the substrate 1 on the substrate locating table 89.

In the related art, it was required for the free ball bearing used in the substrate locating table to have rotation resistance against the main ball as small as possible. However, when the rotation resistance against the main ball is too small, when the substrate 1 is released by spacing the locating members that locates the substrate by interposing it, it was found that the positional deviation due to the flexing of the substrate 1 increases.

As described above, the inventors found that it is possible to restrain or remove the positional deviation of the substrate 1 after the substrate 1 interposed by the position locating members is released, by releasing the substrate 1 interposed by the pair of locating members 89b of the locating device, from the state in which the retainer balls 41 and the main ball 42 are restrained from rotating by pressing the retainer balls 41 with the retainer ball-pressing ring 50.

When the rotation of the main ball 42 after the substrate 1 interposed by the locating members is released is restrained, it is preferable to restrain movement of the substrate 1, using the rotation resistance against the main ball 42, by allowing corresponding rotation of the main ball 42 according to micromotion of the substrate 1, rather than fixing the main ball 42 so as not to be rotated. In this case, it is possible to remove the flexing of the substrate 1 or attenuate stress of the substrate due to the flexing. Further, it is possible to achieve sufficient effect of restraining the entire positional deviation of the substrate 1 after the substrate 1 interposed by the locating members is released.

Therefore, it is not necessary to fix the retainer balls 41 to not be rotated, by pressing the retainer balls 41 with the retainer ball-pressing ring 50.

It needs only to be able to restrain rotation of the main ball 42 by restraining the rotation of the retainer balls 41.

Therefore, the pressing force applied to the retainer ball-pressing ring 50 to press the retainer balls 41 (in other words, a movement force applied to the bearing base) is not necessarily a strong force that can fix the main ball 42 so as not to rotate.

When the rotation of the retainer balls 41 is restrained (pressed) by the retainer ball-pressing ring 50 of the free ball bearing 110, it is possible to achieve a remarkably high friction coefficient in comparison to releasing (when the retainer ball-pressing ring 50 is positioned at the standby position). Therefore, a method of fixing the main ball so as not to rotate when restraining the main ball may be possible.

In the free ball bearing (support device for carrying ball) shown in FIGS. 2A and 2B in Patent Document 2 of the related art, particles generated by contact of a cover member (reference numeral '5a' in Patent Document 2), a pressing member, and leg members are easily scattered. Meanwhile, according to the bearing unit 100 of the embodiment, it is possible to easily implement scattering control of particles (reduction of the scattering amount).

The contact portion between "the driving device (driving-for-pressing device) for moving the retainer ball-pressing ring 50 in the bearing height direction" or "the rod driving plate 63 that is a member for transmitting the driving force of the driving-for-pressing device to the rod 62 mounted on the retainer ball press ring 50" and "the rod 62" is covered by the cover member 120 disposed at the rear side of the composite wall 130. Accordingly, even if particles are generated from the contact portion between "the driving-for-pressing device" or "the rod driving plate 63" and "the rod 62", the particles are not scattered to the rear side of the composite wall 130. Further, the contact portion between "the driving-for-pressing device" or "the rod driving plate 63" and "the rod 62" is spaced apart from the main ball protrusion opening 31 of the housing 30. Therefore, the particles generated at the contact portion have difficulty in reaching the main ball protrusion opening 31 of the housing 30 and being scattered from the main ball protrusion opening 31. Therefore, this effectively contributes to restraining scattering of particles (reduction of the scattering amount) from the main ball protrusion opening 31.

Further, in the bearing unit 100, as described above, contact between the ring-shaped top plate portion 51 of the retainer ball-pressing ring 50 and the cover plate portion 33*a* of the cap 33, contact between the pressing member 55 and the ball retainer 23, contact between the pressing member 55 and the main ball 42, and contact between the ring-shaped top plate portion 51 and the ball retainer 23 are not generated. Therefore, this effectively contributes to restraining scattering of particles (reduction of the scattering amount) from the main ball protrusion opening 31 of the housing 30 of the free ball bearing 110.

(Second Embodiment)

Next, the second embodiment of the present invention is described with reference to FIG. 6.

Figure 6:
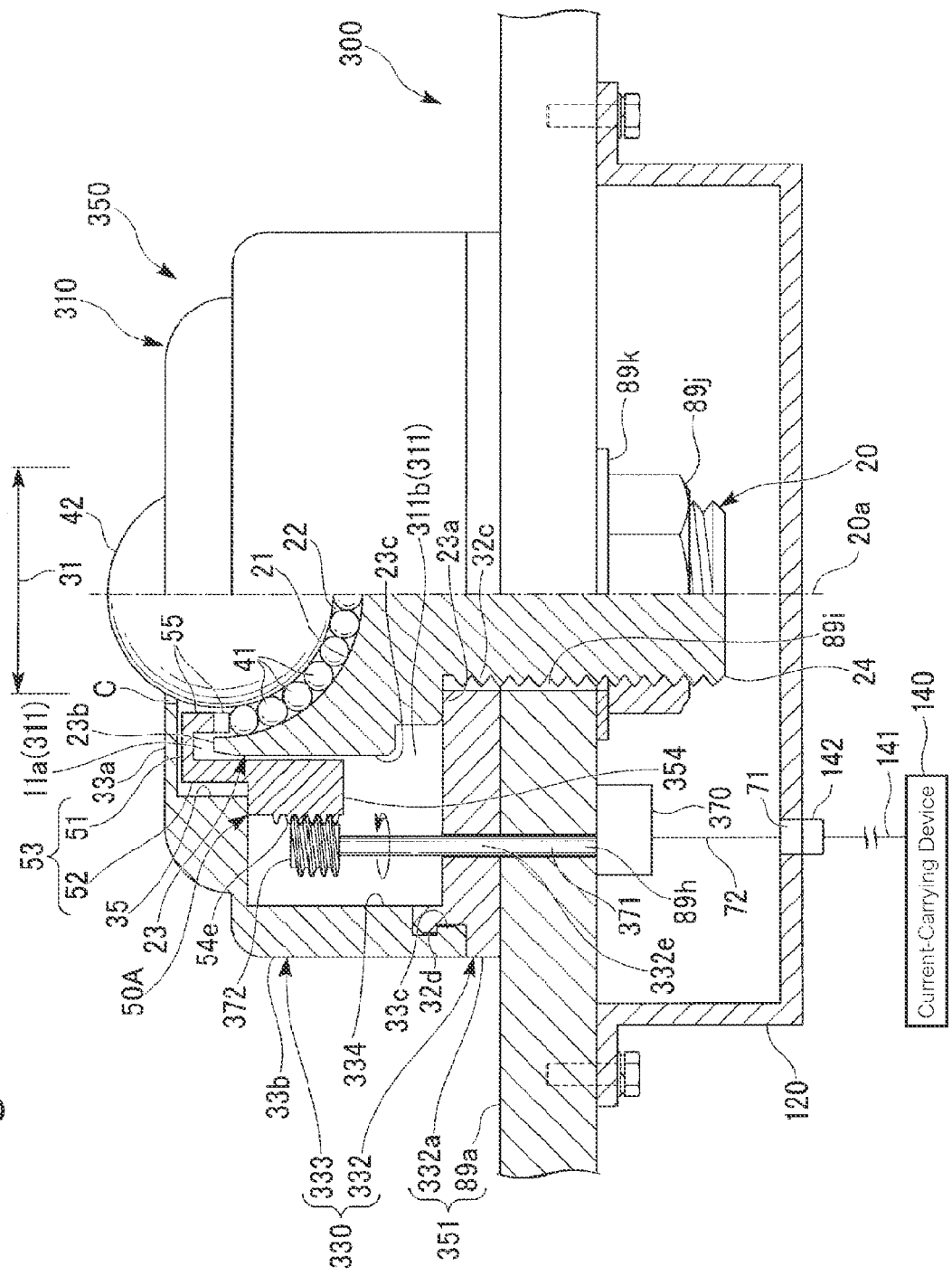
FIG. 6 is a partial cross-sectional view showing a bearing unit and the parts around the free ball bearing according to a second embodiment of the present invention.

As shown in FIG. 6, a bearing unit 300 according to the embodiment uses an electric motor 370 (rotation deriving device) as a driving-for-pressing device. A bearing assembly unit 350 is disposed at a plurality of positions of a bedplate 89*a* of a locating table 89 to dispose to the bearing unit 300. In the bearing assembly unit 350, a free ball bearing 310, the electric motor 370, and a cover member 120 are disposed on the bedplate 89*a*.

The free ball bearing 310 includes a retainer ball-pressing ring 50A, a housing 330, and a driving force transmitting shaft 371, instead of the retainer ball-pressing ring 50, housing 30, and driving force transmitting rod 62 of the free ball bearing 110 described in the first embodiment.

The retainer ball-pressing ring 50A has an engaging-toothed ring portion 354 (base end-sided ring portion) at the base end. Gear engaging teeth 54*e* are formed on the outer circumferential surface 54*b* of the ring portion 354. The gear engaging teeth 54*e* are engaged with a worm 372 (driving force transmitting gear) fixed to the tip of the driving force transmitting shaft 371 (driving force transmitting rod) mounted on the electric motor 370.

A bottom through-hole 332*e* where the driving force transmitting shaft 371 passes is formed at the housing 330.

The driving force transmitting shaft 371 is fixed with the worm 372 disposed in the housing 330.

Further, unlike the first embodiment described above, the spring 61 is not disposed in the embodiment.

In other features, the free ball bearing 110 described in connection with the first embodiment has the same configuration as the free ball bearing 310 of the embodiment.

The driving force transmitting shaft 371 is mounted on the driving shaft to be integrally rotatable by being fitted in the driving shaft of the electric motor 370. The driving force transmitting shaft 371 is rotated by the electric motor 370. Since the worm 372 is fixed to the driving force transmitting shaft 371, the driving force transmitting shaft 371 and the worm 372 are integrally rotated by the electric motor 370.

Further, the engaging-toothed ring portion 354 of the retainer ball-pressing ring 50A exemplified in FIG. 6 is shorter in the bearing height direction than the base end-sided ring portion 54 of the retainer ball-pressing ring 50 exemplified in FIG. 1. However, the size can be appropriately set and may be set to the same size as the base end-sided ring portion 54 of the retainer ball-pressing ring 50 of the first embodiment.

In the housing 330, a ring-shaped cap 333 having the main ball protrusion opening 31 is integrally fitted on the outer circumference of a base end-sided housing member 332. The base end-sided housing member 332 is thread-fastened to the threaded-shaft 24 of the main body 20. The housing 330 is shaped and disposed to receive the ball retainer 23 of the main body 20.

A bottom through-hole 332*e* is formed in the base end-sided housing member 332.

In the housing 330, a ring-shaped space 311*b* that can receive the worm 372 is ensured between the base end-sided housing member 332, the outer circumferential surface 23*c* of the ball retainer 23 of the main body 20, and the inner circumferential surface 334 opposite to the outer circumferential surface 23*c*, of the housing 330. The housing 330 of the embodiment is different in this configuration from the housing 30 of the first embodiment. The housing 30 and the housing 330 are substantially the same in other features. In FIG. 6, the same configurations as the housing 30 of the free ball bearing 110 of the first embodiment are given the same reference numerals.

The base end-sided housing member 332 has a fitting protrusion 33*c* to be fitted in the cap 333 on the outer circumference of a ring-shaped bottom plate 332*a* and is an entirely plate-shaped member. Further, the base-sided housing member 332 is thread-fastened to the outer side of the threaded-shaft 24 by a female threaded-hole 32*c* formed through the center portion of the bottom plate 332*a*, and mounted perpendicular to the bearing height direction (perpendicular to the center axis line 20*a* of the main body 20). Further, in FIG. 1, the bottom plate 332*a* of the base-sided housing member 332 is contact with the bottom 23*a* of the ball retainer 23.

On the other hand, the cap 333 has a configuration in which a side wall 33*b* protruding from one end surface of a ring-shaped cover plate 33*a* is formed on the outer circumference of the cover plate 33*a* where the main ball protrusion opening 31 is formed. The engaging protrusion 33*c* formed on the inner circumferential surface of the side wall 33*b* is fitted in the base end-sided housing member 332 by inserting the engaging protrusion 33*c* in the base end of the engaging protrusion 32*d* formed on the outer circumference of the base end-side housing member 332. The end surface (tip surface 23*b*) around the opening of the ball-retaining recess 22 of the ball retainer 23 of the main body 20 is covered by the cover plate portion 33*a*.

Similar to the first embodiment described above, a tip-sided space 11a is ensured between the cover plate portion 33a of the cap 333 and the ball retainer 23.

An internal space 311 defined by the tip-sided space 11a and a ring shaped space 311b communicating with the outer circumference of the tip-sided space 11a is ensured between the housing 330 and the ball retainer 23.

Further, the bearing end tip (the upper part in FIG. 6) of the ring-shaped space 311b is narrower in comparison with the bearing base end (the lower part in FIG. 6) than the protruding wall 35 by the protruding wall 35 expanding from the inner circumference of the side wall 33b of the cap 33.

In the free ball bearing 310, a threaded-shaft 24 of the main body 20 is inserted in a bearing main body insertion hole 89i that is a through-hole formed in the bedplate 89a. The bottom plate 332a of the housing 330 is mounted and fixed to the bedplate 89a in contact with the bedplate 89a by tightening a nut 89j thread-fastened to the portion protruding from the rear side of the bedplate 89a of the threaded-shaft 24. Reference numeral '89k' in FIG. 6 indicates a washer.

Further, one bottom through-hole 332e formed through the bottom plate 332a is aligned and communicates with a through-hole 89h (mounting plate through-hole, hereafter, referred to as a shaft insertion hole) formed through the bedplate 89a.

The shaft insertion hole 89h is formed to have substantially the same inner diameter as the bottom plate through-hole 332e.

Further, in FIG. 6, the female threaded-hole 89g (not shown) of the bedplate 89a may be a through-hole formed through the bedplate 89a or a non-through-hole that is not formed through the bedplate 89a. The non-through-hole is preferable to ensure higher airtightness.

The bottom plate 332a of the housing 330 and the bedplate 89a constitute a composite wall 351. The electric motor 370 is disposed on the rear side of the bedplate 89a (the bottom in FIG. 6, the rear side of the composite wall 351) and fixed to the bedplate 89a.

Further, in the bearing assembly unit 350 and the bearing unit 300, the portion protruding from the outer side (bearing base end) of the housing 330 through the bottom through-hole 332e of the bottom plate 332a of the housing 330, of the driving force transmitting shaft 371 of the free ball bearing 310, passes through the shaft insertion hole 89h of the bedplate 89a and the base end portion opposite to the tip portion where the worm 372 is fixed is mounted on the output shaft of the electric motor 370 on the rear side of the bedplate 89a.

The worm 372 is disposed in the ring-shaped space 311b of the free ball bearing 310 and engaged with the gear engaging teeth 54e of the engaging-toothed ring portion 354 of the retainer ball-pressing ring 50A. Further, the retainer ball-pressing ring 50A can be moved in the bearing height direction by rotating the driving force transmitting shaft 371 with the electric motor 370. That is, the engaging-toothed ring portion 354 of the retainer ball-pressing ring 50A functions as a worm wheel and the retainer ball-pressing ring 50A is moved in the bearing height direction by the rotation of the driving force transmitting shaft 371 where the worm 372 is fixed.

The electric motor 370 is covered by the cover member 120 mounted on the rear side of the composite wall 351. A current-carrying device 140 which is disposed apart from the bearing unit 300 is electrically connected to the electric motor 370 via a power supply connection terminal 71 disposed at the cover member 120 and a conductive circuit 72 in the cover member 120. The electric motor 370 rotates the driving force transmitting shaft 371, using the power supplied from the current-carrying device 140.

The current-carrying device 140 functions as a controller that controls the driving of the electric motor 370. The electric motor 370 can switch forward/backward the rotational direction of the driving force transmitting shaft 371 by the control of the current-carrying device 140. Therefore, in the bearing assembly unit 350 and the bearing unit 300, the retainer ball-pressing ring 50A can move from the standby position to the retainer ball-pressing position and from the retainer ball-pressing position to the standby position.

In the embodiment, the driving-for-pressing device (electric motor 370) is disposed on the rear side of the composite wall 351 and spaced apart from the main ball protrusion opening 31 of the housing 330. Therefore, particles generated from the driving-for-pressing device have difficulty in reaching the main ball protrusion opening 31 of the housing 330, which effectively contributes to suppressing scattering of the particles (reduction of the scattering amount) from the main ball protrusion opening 31.

Further, the worm 372 is disposed between the engaging-toothed ring portion 354 of the retainer ball-pressing ring 50A and the inner circumferential surface 334 of the housing 330 (the inner surface of the housing opposite to the outer circumferential surface of the ball retainer 23 through the ring-shaped space 311b) while the contact point between the worm 372 and the gear engaging teeth 54e of the retainer ball-pressing ring 50A is spaced apart from the main ball protrusion opening 31 of the housing 330.

Therefore, even if particles are generated from the contact point between the worm 372 and the gear engaging teeth 54e of the retainer ball-pressing ring 50A, the particles has difficulty in reaching the main ball protrusion opening 31. Accordingly, this effectively contributes to restraining the scattering of particles (reduction of the scattering amount) from the main ball protrusion opening 31.

Further, the distance between the engaging-toothed ring portion 54 of the retainer ball-pressing ring 50A and the outer circumferential surface of the ball retainer 23 is preferably restrained to be small, as in the first embodiment.

This is the same as other embodiments.

Further, in the example shown in the figure, although a configuration in which the retainer ball-pressing ring 50A is moved in the bearing height direction by the rotation of the worm 372 engaged with the gear engaging teeth 54e of the retainer ball-pressing ring 50A, the present invention is not limited thereto. For example, a configuration that rotates a pinion gear engaged with a rack formed on the outer circumferential surface of the base end-sided ring portion of the retainer ball-pressing ring 50, using the electric motor, may be used.

(Third Embodiment)

Figure 7A:
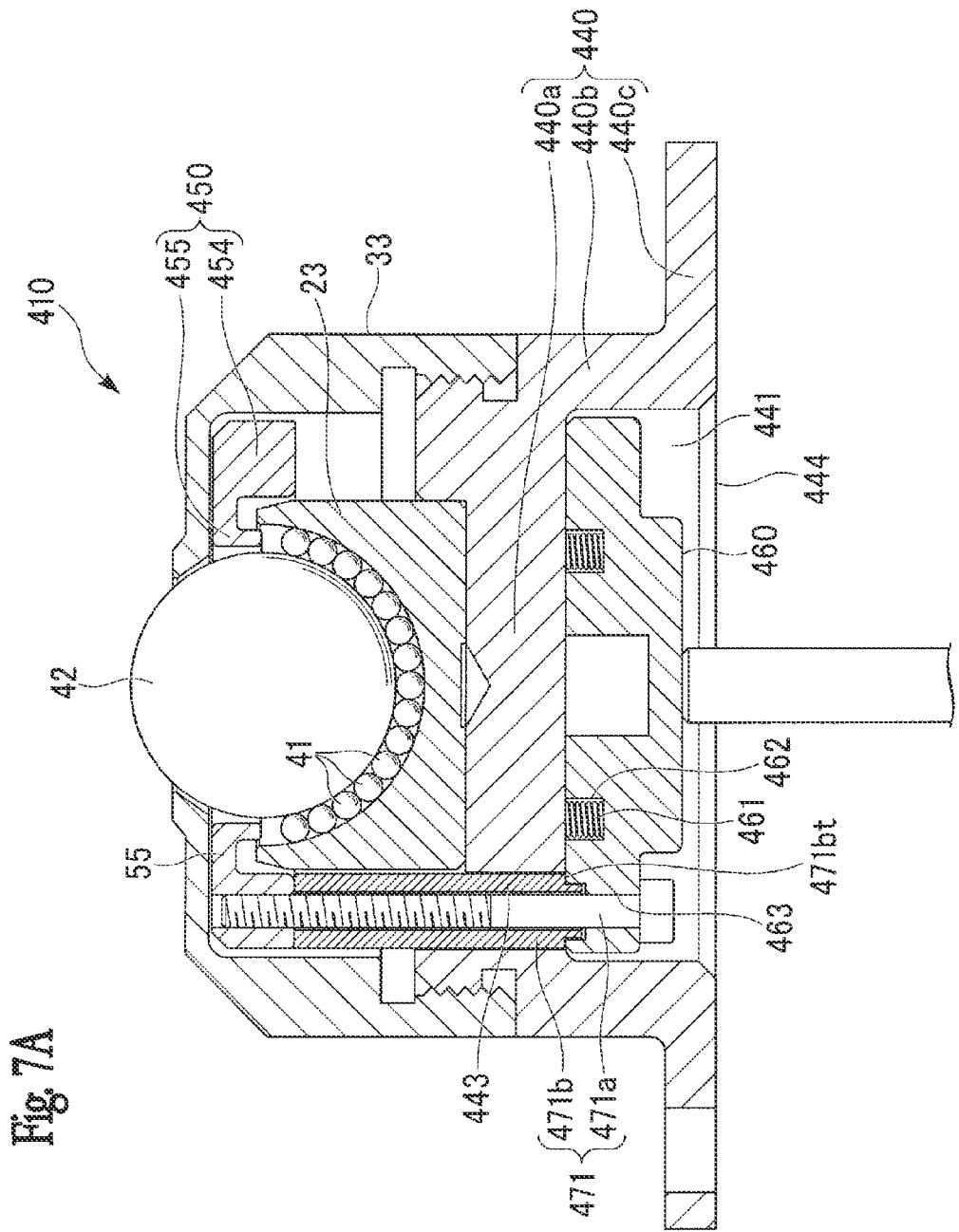
FIG. 7A is a view showing a standby state of a free ball bearing according to a third embodiment of the present invention.
Figure 7B:
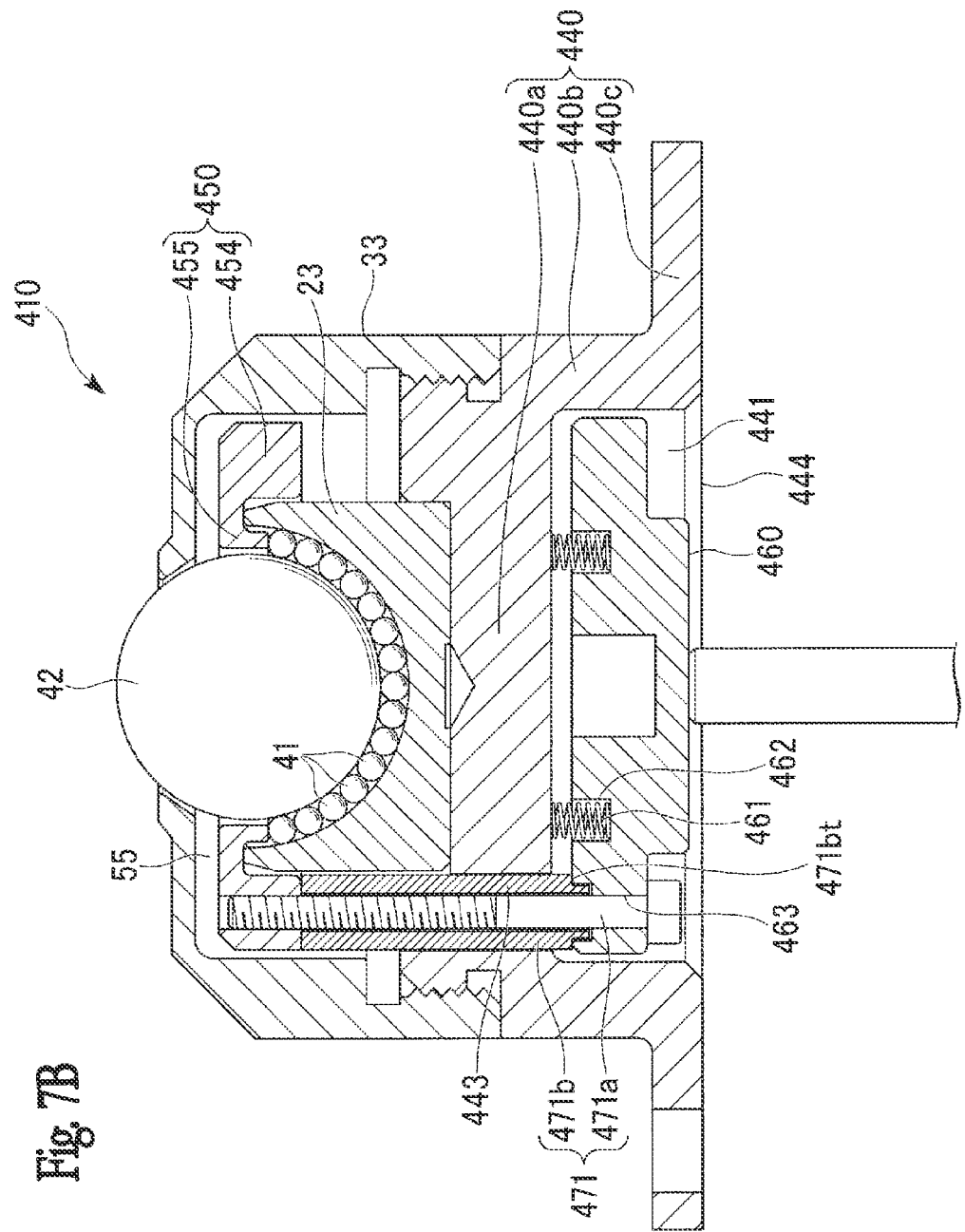
FIG. 7B is a view showing a restrained state of the free ball bearing.

The third embodiment of the present invention is described with reference to FIGS. 7A and 7B. The description of the same features as those of the first and second embodiments is not provided and the differences are described in detail.

A free ball bearing 410 of the embodiment includes a retainer ball-pressing ring 450, a reciprocating member 460 (movable body), and a driving force transmitting shaft 471, as a driving-for-pressing device. A housing 430 of the free ball bearing 410 has a female thread on the inner side of the lower end.

A base 440 has a substantially disc-shaped top plate portion 440a, a substantially cylindrical side portion 440b, and a flange 440c expanding radially outward from the lower end of the side portion 440b.

The base 440 has a male thread on the outer side of the upper portion of the side portion 440b. The female thread of the housing 430 is thread-fastened to the male thread of the base 440 with a washer therebetween. The ball retainer 23 is fitted and fixed in a recess on the top of the base 440.

A cylindrical cylinder space 441 is defined in the base 440. In the embodiment, the cylinder space 441 is disposed coaxially with the ball retainer 23, at the base end of the ball retainer 23. The cylinder space 441 is larger in diameter than the ball retainer 23.

The cylinder space 441 is open to the base end. The flange 440c is formed at the base portion of the base 440, surrounding the opening 444. The flange 440c has a plurality of threaded-holes to fix the bearing unit, in a table not shown.

A through-hole 443 is formed through the outer end of the top plate portion 440a of the base 440, in the center axis direction of the unit.

The substantially disk-shaped reciprocating member (movable body) 460 is disposed at the center of the cylinder space 441.

The driving force transmitting shaft 471 has a threaded-portion 471a and a substantially cylindrical collar 471b surrounding the threaded-portion 471a. The collar 471b has a substantially cylindrical shape having uniform outer diameter d1 and inner diameter d2 in the longitudinal direction. Further, a collar small-diameter portion 471bs having an outer diameter d3 is formed at the base end of the collar 471b. The size of d3 is d1>d3>d2. A collar stepped portion 471bt exists at the interface where the outer diameter of the collar 471b changes from d1 to d3. The collar 471b is fitted in a through-hole 443 of the base 440 to be slidable in the center axis direction of the unit. The base end of the collar 471b is fitted in a through-hole 443 of the reciprocating member 460, which is described below.

The diameter of the reciprocating member 460 is slightly smaller than the inner diameter of the cylinder space 441. In this case, a clearance exists between the inner wall of the cylinder space 441 and the outer end of the reciprocating member 460, such that there is no direct contact. Meanwhile, as a modified example A, the outer end of the reciprocating member 460 may be in contact with the inner wall of the cylinder space 441 by making the diameter of the reciprocating member 460 the same as the inner diameter of the cylinder space 441. In the modified example A, the reciprocating member 460 can slide in the center axis direction of the unit from the tip to the base end, in the cylinder space 441.

A plurality of through-holes 463 is formed in the reciprocating member 460. The inner diameter of the upper end (tip) of the through-hole 463 is substantially the same as the outer diameter d3 of the collar small-diameter portion 471bs. The collar stepped portion 471bt is connected to the top of the reciprocating member 460, around the upper end of the through-hole 463.

A spring hole 462 is formed on the top of the reciprocating member 460. The spring hole 462 is a circular hole and does not pass through the reciprocating member 460 in the thickness direction. The spring hole 462 is, for example, formed to ⅓ of the thickness of the reciprocating member 460 from the top of the reciprocating member 460. The spring 461 that is longer than the depth of the spring hole 462 is inserted in the spring hole 462. The end of the base end of the spring 461 is in pressed contact with the bottom of the spring hole 462. The end of the tip of the spring 461 is in pressed contact with the base end surface (bottom of FIG. 7A) of the top plate portion 440a of the base 440. By this configuration, the spring 461 biases the reciprocating member 460 to the base end with respect to the base 440.

The through-hole 463 of the reciprocating member 460 is disposed outward from the spring hole 462. A plurality of through-holes 463 is circumferentially disposed at regular intervals, and at least two, preferably three or more, for example, four, or six, or more through-holes are formed. When there are many through-holes 463, the operational stability of the reciprocating member 460 increases, but the manufacturing cost increases. In FIGS. 7A and 7B, three through-holes 463 are formed (only one through-hole 463 is shown in the cross-section in the figure). The through-holes 443 of the base 440 are formed to fit the number and position of the through-holes 463. The driving force transmitting shafts 471 are inserted in the pairs of corresponding through-holes 443 and through-holes 463. As the collar 471b of the driving force transmitting shaft 471 moves with friction on the inner wall of the through-hole 443, the operation of the driving force transmitting shaft 471 is regulated in the center axis direction of the unit.

A female threaded-portion 454g is formed on the base end surface of the base end-sided ring portion 454 of the retainer ball-pressing ring 450. The tip end of the threaded-portion 471a of the driving force transmitting shaft 471 is thread-fastened to the female threaded-portion 454g. As the threaded-portion 471a is thread-fastened in the female threaded-portion 454g, the reciprocating member 460 and the retainer ball-pressing ring 450 are fixed through the collar 471b.

The reciprocation of the reciprocating member 460 is transmitted to the retainer ball-pressing ring 450 through the driving force transmitting shaft 471. Therefore, the elastic bias force of the spring 461 presses down the retainer ball-pressing ring 450 toward the base end. By this operation, the retainer ball-pressing ring 450 moves to the retainer ball-pressing position and the press member 455 presses down the retainer balls with a predetermined stable pressure (FIG. 7B). Accordingly, braking of the retainer balls is performed. The pressure can be appropriately adjusted by appropriately changing the number of the spring 461, the strength of the spring 461 and the depth of the spring hole 462.

At least a portion of the base end-sided bottom of the reciprocating member 460 is exposed to the outside of the base end of the bearing unit 400 through the base end-sided opening 444 of the base 440. It is possible to move the reciprocating member 460 in the direction opposite to the elastic bias direction of the spring 461 (toward the tip) by pushing up the exposed portion, for example, with a press bar (FIG. 7A). In this process, the retainer ball-pressing ring 450 stably moves from the retainer ball-pressing position to the standby position in the axial direction of the unit. When the reciprocating member 460 is in contact with the bottom (base end-sided surface) of the top plate portion 440a of the base 440, the movement of the reciprocating member 460 is stopped. Accordingly, the movement of the retainer ball-pressing ring 450 is stabilized and stopped at a predetermined position. In this configuration, locating to the standby position is stably performed, with the retainer ball-pressing ring 450 not in direct contact with another member. Therefore, in the embodiment, it is possible to achieve a remarkably preferable effect in view of the restriction of the scattering of particles.

(Fourth Embodiment)

A free ball bearing 510 according to the fourth embodiment of the present invention is described with reference to FIGS. 8A and 8B. The description of the same features as those of the first to third embodiments is not provided and the differences are described in detail.

In the free ball bearing 510 of the embodiment, a cap 533 of a housing 530 and a retainer ball-pressing ring 550 are formed in an integral member. In this configuration, for example, as compared with the configuration of the third embodiment, the number of parts is small, an effect of considerably reducing the manufacturing cost is achieved.

Further, when the retainer ball-pressing ring 550 moves to the base end from the standby position toward the pressing position, the cap 533 correspondingly moves to the base end. In this process, the inner diameter of the main ball protrusion opening 531 may be set such that the main ball protrusion opening 531 of the cap 33 comes in contact with the main ball 42.

In this case, when the rotation of retainer balls 41 and the main ball 42 is restricted at the pressing position, the main ball protrusion opening 531 can support and stabilize the main ball 42. When a conveyed item is braked, a reacting force from the conveyed item to the main ball 42 is generated in the radial direction with respect to the center axis direction of the unit. In this case, as the main ball protrusion opening 531 assistantly supports the main ball 42, the main ball 42 can be more stabilized.

In the embodiment, only one spring hole 562 and one spring 561 are disposed at on the center axis of the unit. In this case, the number of parts is reduced, such that the manufacturing cost is restrained.

(Fifth Embodiment)

A free ball bearing 710 according to the fifth embodiment of the present invention is described with reference to FIGS. 9A, 9B, and 9C. The description of the same features as those of the first to fourth embodiments is not provided and the differences are described in detail.

A cap 33 of the embodiment is fitted in a groove formed on the outer circumference of the upper end of a base 740.

A female thread is formed on the inner side of a housing member (case) 732. A male thread is formed on the outer side of the base 740. The male thread of the base 740 is thread-fastened to the female thread of a housing member 732.

A threaded-shaft 724 is convexly formed at the center of the base end of the housing member 732. An access hole 790 passing through the housing member 732 in the axial direction is formed in the threaded-shaft 24. A connecting member 701 is inserted in the access hole 790. The shape and material of the connecting member 701 are not specifically limited, and for example, a low head shoulder bolt made of stainless steel may be used.

A female threaded-through hole 700*a* passing through a reciprocating member 760 in the thickness direction is formed at the center of the reciprocating member 760. The threaded-portion at the tip of the connecting member 701 is thread-fastened to the female threaded-through hole 700*a* of the reciprocating member 760.

Figure 9A:
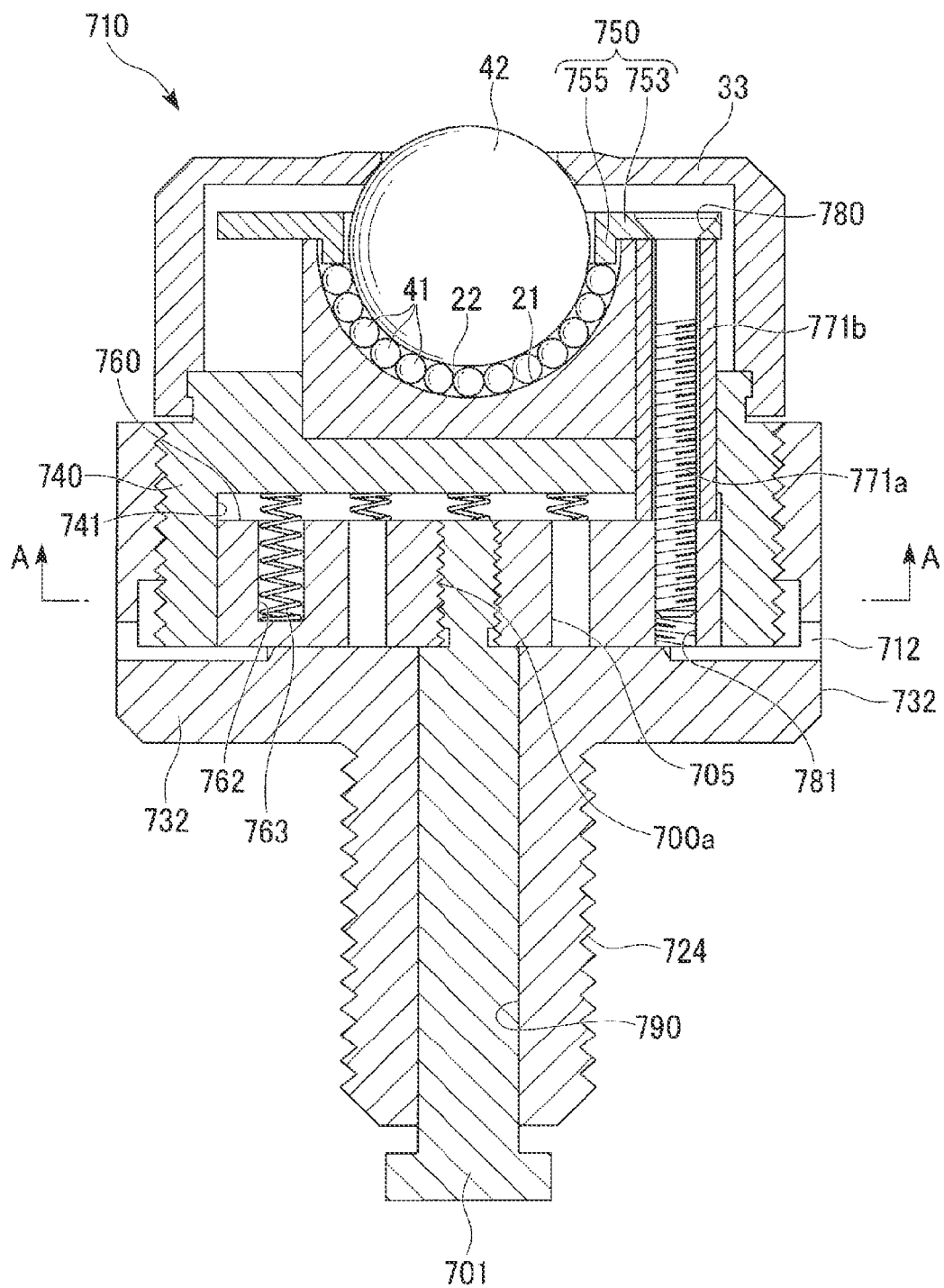
FIG. 9A is a front cross-sectional view showing a restrained state of a free ball bearing according to a fifth embodiment of the present invention.
Figure 9B:
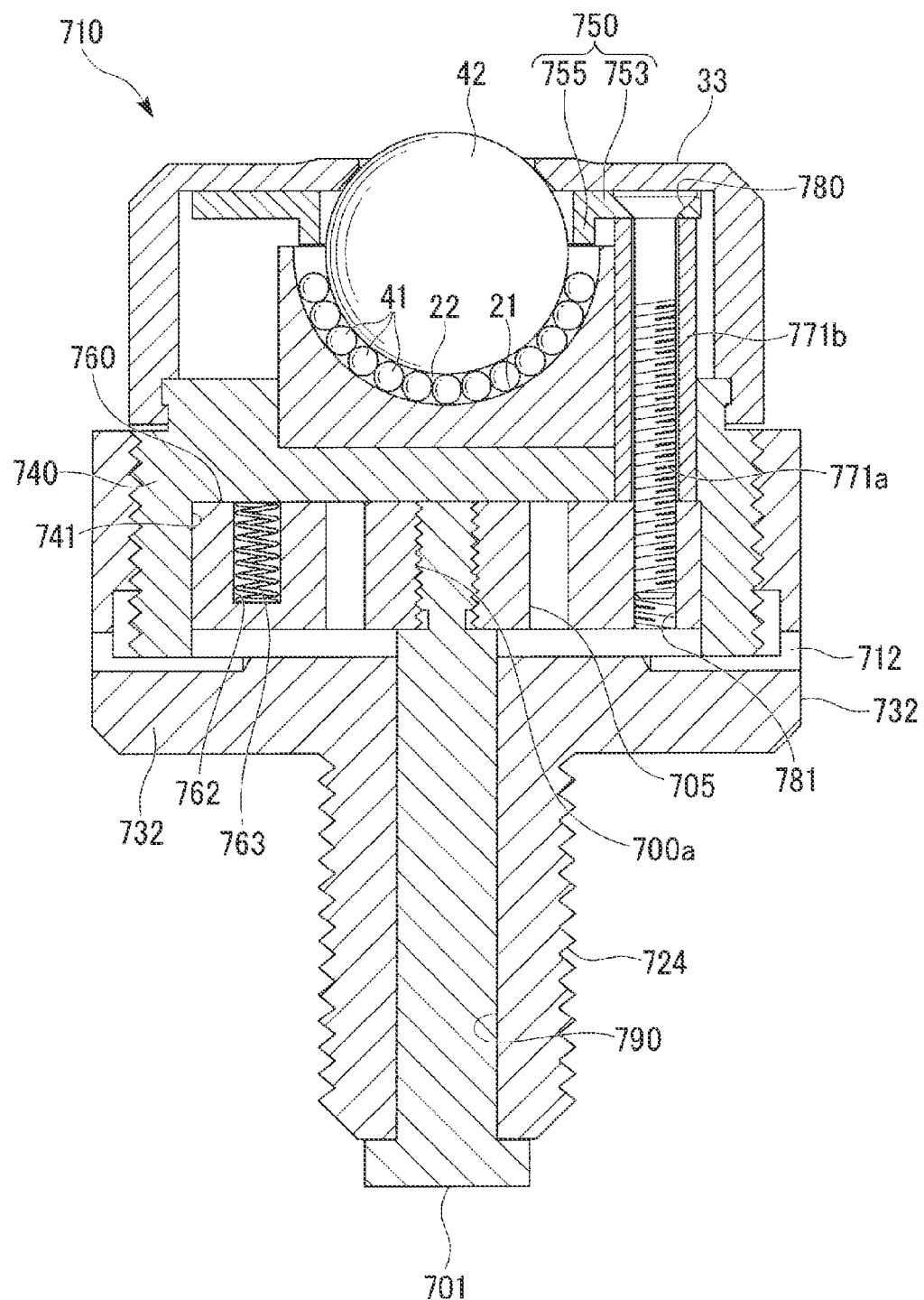
FIG. 9B is a side cross-sectional view showing a standby state of the free ball bearing.

As shown FIG. 9C that is an upper cross-sectional view taken along the surface of A-A in FIG. 9A, spring holes 762 are formed at nine positions at the reciprocating member 760. A spring 763 is inserted in the each spring hole 762. The number of the spring holes 762 is not necessarily nine. It is preferable that the plurality of spring hole 762 are entirely point-symmetrically arranged with respect to the center axis of the reciprocating member 760. Further, a plurality of air-through holes 705 is formed and disposed between pairs of spring holes 762. The air-through holes 705 pass through the reciprocating member 760 in the thickness direction.

A cylindrical cylinder space 741 is defined in the base 740. The outer diameter of the reciprocating member 760 and the inner diameter of a cylinder space 741 are substantially the same. As the reciprocating member 760 is inscribed in the cylinder space 741, the movement direction of the reciprocating member 760 is stably regulated to the axial direction.

In the embodiment, the air-through holes 705 are formed such that the reciprocating member 760 fails to hermetically close the cylinder space 741. Therefore, it is possible to secure free movement of the reciprocating member 760. Further, a plurality of outer surface air-through holes 712 is radially formed through the outer surface housing member 732 to prevent separation of air inside the main body.

A retainer ball-pressing ring 750 of the embodiment includes a flat ring-shaped main body ring 753 and a pressing member 755, but does not include a base end-sided ring. The outer diameter of the main body ring 753 is the length obtained by subtracting a clearance distance that prevents contact friction (generation of particles) from the inner diameter of the cylindrical portion of the cap 33. A bowl-shaped through-hole 780 shaped to receive the head of a screw 771*a* is formed around the outer end of the main body ring 753. A driving force transmitting shaft 771 has the screw 771*a* and a collar 771*b*. The screw 771*a* is inserted in the bowl-shaped hole 780 and the collar 771*b*, with the head at the tip, and the base end-sided end is inserted from the tip and thread-fastened to a female-through thread 781 formed on the reciprocating member 760. Therefore, the retainer ball-pressing ring 750 and the reciprocating member 760 are integrally combined through the driving force transmitting shaft 771. The shape of the screw 771*a* may be, for example, a countersunk screw.

In the embodiment, the collar 771*b* is inserted in the through-hole of the base 740, which is the same as the third embodiment. The collar 771 may move with friction in contact with the inner side of the through-hole of the collar 771*b* and the base 740 while being regulated in the axis reaction, or a clearance may be defined such that they are not in contact with each other.

In the embodiment, the outer end of the reciprocating member 460 may be in contact with the inner wall of the cylinder space 441 by making the outer diameter of the reciprocating member 760 the same as the inner diameter of the cylinder space 741, or a clearance may be defined to prevent contact.

Further, in the embodiment, the outer end of the reciprocating member 701 may be in contact with the inner wall of the access hole 790 by making the outer diameter of a coupling member 701 the same as the inner diameter of the access hole 790, or a clearance may be defined to prevent contact.

When the axial operation of the collar 771*b* is regulated, the distance between the collar 771*b* and the retainer ball-pressing ring 750 is small, such that it is possible to achieve a more stable operation.

When the axial operation of the reciprocating member 760 or the coupling member 701 is regulated, it is possible to restrict generation of particles due to friction in the cylinder space 741 or to the base end.

The coupling member 701 moves the reciprocating member 760 to the tip by pressing the end of the base end. The pressing force and the movement are transmitted to the retainer ball-pressing ring 750 through the driving force transmitting shaft 771 and the retainer ball-pressing ring 750 moves to the standby position from the pressing position. When the pressing of the end of the base end of the coupling member 701 is stopped, the reciprocating member 760 is moved to the base end by the bias force of the spring 763 and the retainer ball-pressing ring 750 moves to the pressing position from the standby position through the driving force transmitting shaft 771. In this process, in the embodiment, the reciprocating member 760 comes in contact with the bottom of the base end of the cylinder space 741 (the top of the housing member 732 in FIG. 9A) and then stops. Therefore, excessive bias force of the spring is prevented and wear of the retainer balls 41 due to the excessive pressing force is prevented. When the bias force of the spring is appropriately adjusted, the thickness of the reciprocating member 760 may be set such that the reciprocating member does not come in contact with the bottom of the base end of the cylinder space 741.

Further, it is possible to change the bias force direction of the spring 763 to the inverse direction by turning the reciprocating member 760 over. In this case, the bias force of the spring 763 moves the retainer ball-pressing ring 750 to the standby position. On the other hand, the retainer ball-pressing ring 750 is moved to the pressing position by pulling the end of the base end of the coupling member 701 toward base end.

(Support Table Equipped with Elevator Mechanism)

Figure 10:
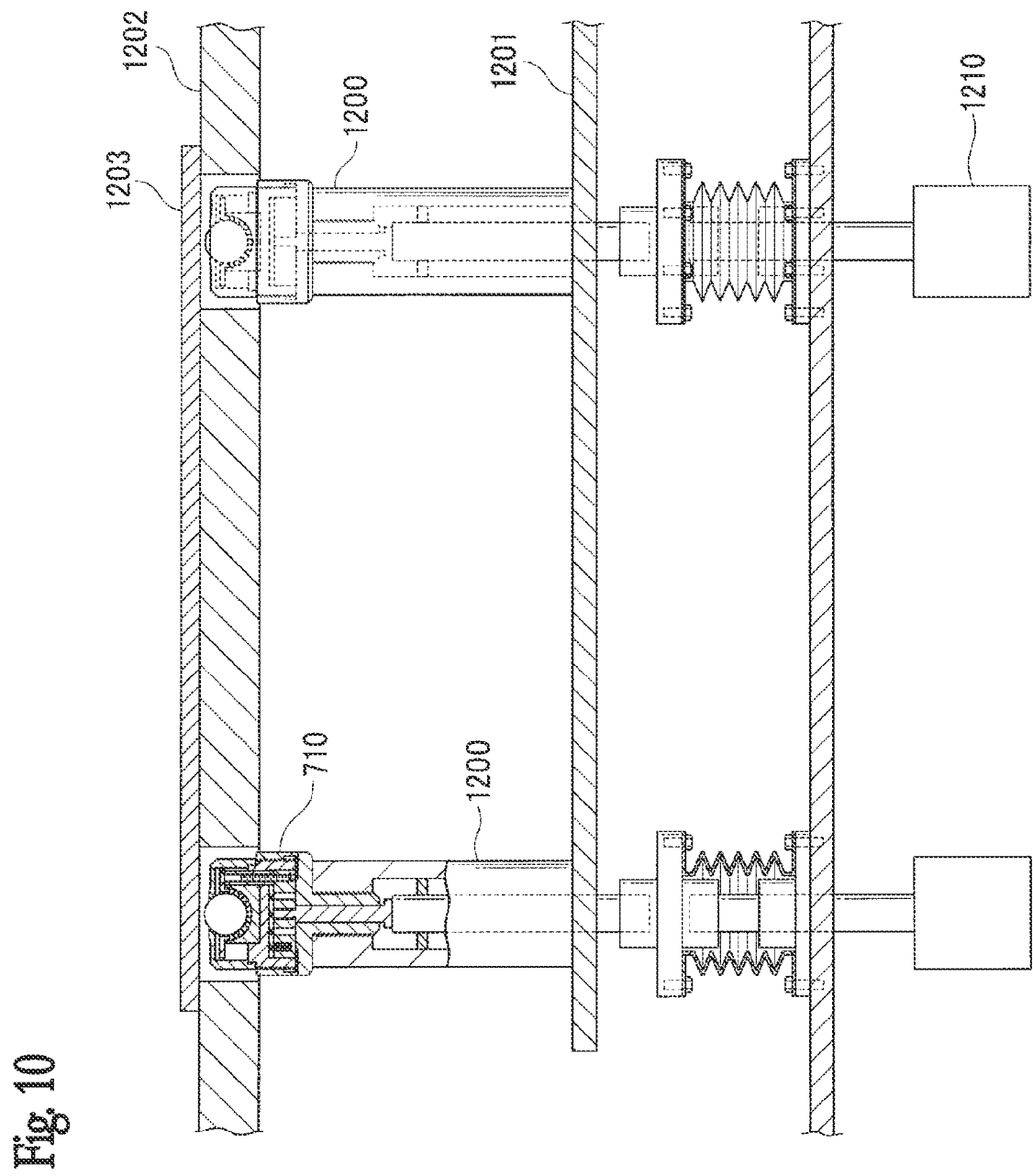
FIG. 10 is a front view illustrating an elevator that moves up/down the free ball bearing.

As shown in FIG. 10, the free ball bearings 110 and 710 of the embodiments of the present invention can be used for a support table equipped with an elevator table. In this case, the support table includes a plurality of cylindrical support members 1200. The free ball bearing 110 is fastened to the upper end of the support member 1200. All of the support members 1200 are collectively supported on an elevator table 1201. The elevator table 1201 can be moved up/down in a horizontal status by an elevator mechanism, which is not shown. As the elevator table 1201 is moved up, with a carried item 1203, such as a glass substrate, placed on a placing table 1202, a plurality of free ball bearings 110 lift the carried item 1203 from the placing table 1202 while holding the carried item 1203. In this process, it is possible to stably hold the carried item 1203 by keeping the rotation of the main ball of the free ball bearing 110 restrained. It is possible to deliver the carried item 1203, for example, a robot arm (not shown), with the elevator table 1201 lifted.

For example, it is preferable to assemble the free ball bearing 710 of the fifth embodiment with the elevator mechanism. In this case, the free ball bearing 710 can keep the rotation of the main ball restrained, under a constant pressure, with the built-in spring. Therefore, the carried item 1203 can be stably held even while the elevator table 1201 is lifted. Further, it is possible to simply restrain rotation of the main ball only by applying pressure from under the free ball bearing 710. The pressure can be easily achieved by using a pressing member 1210, such as an air cylinder.

(Sixth Embodiment)

Figure 11:
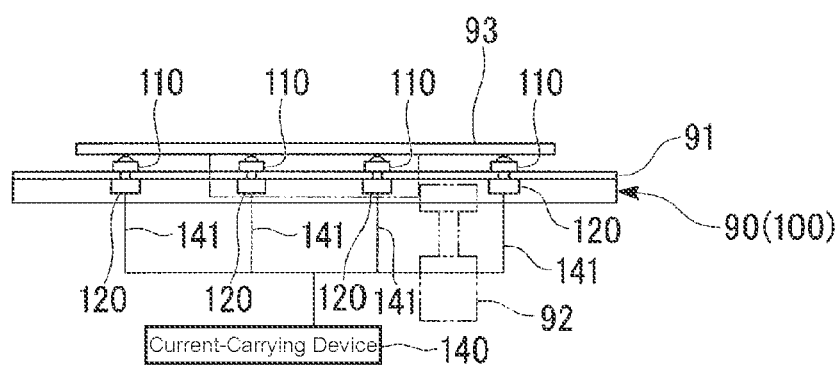
FIG. 11 is a view showing a turntable according to a sixth embodiment of the present invention.

FIG. 11 is a modified example showing a turntable 90 including a plurality of free ball bearings 110 according to the embodiment.

The turntable 90 includes a plate-shaped base member 91, a rotary table 93 mounted on the base member 91 and rotatably supported by a plurality of (three or more) free ball bearings 110 protruding from the top of the base member 91, and a rotation driving device 92 (motor) that rotates the rotary table 93. Though not shown in the figure, a driving-for-pressing device and a cover member are disposed at the cover member 91, which implements a bearing unit having the same configuration as the bearing unit of the first embodiment. The rotary table 93 is supported in contact with the main balls 42 of the free ball bearings 110.

The turntable makes the base member function as a bearing mounting plate for mounting the free ball bearings, the free ball bearings are mounted on the base member, and for example, the rotary table may be supported by the free ball bearings of the bearing unit by assembling any one of the bearing units of the first to fifth embodiments.

The bearing unit and the support table according to the embodiment may be used as a portion of the carrying device that carries a substrate or other items in a vacuum device.

(Various Modified Examples)

The bearing unit according to the embodiment is not limited to the configuration in which the bedplate and the outer wall of the vacuum room are horizontally arranged, and a configuration with the bearing mounting plate inclined at an angle (including a right angle) from the horizontal may be included. In this case, the main ball of the free ball bearing may be used in contact with the side of a workpiece, including the end surface of the outer circumference of the substrate, for example. The bearing unit may have a configuration, for example, in which a free ball bearing is mounted on a bearing mounting plate disposed at a column-shaped bearing support or a ring-shaped bearing support vertically disposed in the vacuum room.

As an item (workpiece) other than the substrate, for example, a precision-machined bending plate, a pipe, and a ring, and the bearing unit and the support table according to the embodiment can be used for carrying, supporting, and locating in the vacuum device when layering or performing a surface process on the member in the vacuum device.

Further, the bearing unit according to the embodiment also includes a configuration in which only one free ball bearing is mounted on the bearing mounting plate of the bearing support.

Further, in the embodiment, for example, in FIG. 11, it may be possible to use a non-magnetic body (for example, SUS304) as the cover member 120, magnetically attract the rod driving plate 63 formed of a magnetic body or the rod 62 itself formed of a magnetic body from the outside of the cover member 120, using the electromagnet (driving-for-pressing device) disposed at the outside (on the rear side of the composite wall), and allow the retainer ball-pressing ring to move from the standby position to the retainer ball-pressing position.

INDUSTRIAL APPLICABILITY

In the free ball bearings according to the embodiments of the present invention, the main balls are not worn and particles due to wear are not scattered. Further, since the main balls are not directly controlled, outgas generated from the particles or grease is not discharged, in the carrying environment, such as the vacuum chamber and the clean room where a workpiece (carried item) is disposed. Therefore, it is possible to restrain contamination of the carrying environment or the workpiece, such as a substrate. Further, since the main balls are not directly braked, the main balls can be braked, with the position accurately maintained.

REFERENCE SIGNS LIST

1: SUBSTRATE
20: MAIN BODY
30: BALL RETAINER
30: HOUSING
41: RETAINER BALL
42: MAIN BALL
50, 50A, 50A', 50B, 501: RETAINER BALL-PRESSING RING
61: RETURNING MEANS (SPRING)
81: VACUUM DEVICE
82: VACUUM ROOM (LOAD LOCK CHAMBER)
83: VACUUM ROOM (TRANSFER CHAMBER)
84: VACUUM ROOM (PROCESSING ROOM)
89: SUPPORT TABLE (SUBSTRATE LOCATING TABLE)
89a: BEARING MOUNTING PLATE (BEDPLATE)

100: BEARING UNIT
110, 310, 410, 510, 710: FREE BALL BEARING
120: COVER MEMBER

The invention claimed is:

1. A bearing unit comprising:
a ball retainer having a semispherical recessed surface;
a plurality of retainer balls disposed on the semispherical recessed surface, the plurality of retainer balls having a first diameter;
a main ball rotatably supported by the plurality of retainer balls and having a second diameter larger than the first diameter;
a housing that has a shape surrounding the ball retainer, has a circular opening smaller than the second diameter, and is disposed such that a portion of the main ball protrudes toward a tip end from a base end through the opening;
a retainer ball-pressing ring disposed in the housing; and
a ring moving mechanism that is connected with the retainer ball-pressing ring, wherein:
the retainer ball-pressing ring includes a substantially cylindrical pressing member inserted in an internal space between the semispherical recessed surface and the main ball toward the base end;
the retainer ball-pressing ring is moved by the ring moving mechanism from a pressing position to a standby position along an unit center axis that extends along a protrusion direction of the main ball and passes through a center of the main ball;
when the retainer ball-pressing ring is at the pressing position, the pressing member restricts or prevents rotation of the plurality of retainer balls by pressing the plurality of retainer balls; and
when the retainer ball-pressing ring is at the standby position, the plurality of retainer balls of which the rotation is restrained or prevented by the pressing member is released.

2. The bearing unit according to claim 1, wherein:
the housing has an access hole formed from an outside to an inside at the base end;
the ring moving mechanism includes a spring that moves the retainer ball-pressing ring to the pressing position by elastically biasing the ring moving mechanism toward the base end, and an operation part that approaches the access hole of the ring moving mechanism; and
the retainer ball-pressing ring is moved to the standby position by pressing the operation part of the ring moving mechanism toward the tip end.

3. The bearing unit according to claim 1, further comprising:
a base member accommodated at the base end in the housing, having a cylindrical cylinder space therein, and having a through-hole that allows the cylinder space and an inside of the housing to communicate with each other;
a movable body disposed to be movable along the unit center axis in the cylinder space; and
a connecting member inserted in the through-hole of the base member and which connects the retainer ball-pressing ring with the movable body.

4. The bearing unit according to claim 3, wherein the spring applies an elastic bias force to the movable body such that the movable body moves toward the base end with respect to the base member, and the elastic bias force is transmitted to the retainer ball-pressing ring through the connecting member.

5. The bearing unit according to claim 1, wherein the ring moving mechanism includes:
a spring that elastically biases the retainer ball-pressing ring toward the tip end; and
a braking member connected to the ring moving mechanism and which moves the ring moving mechanism to the pressing position toward the base end.

6. The bearing unit according to claim 5, wherein the braking member is an electromagnet that applies a movement force to the retainer ball-pressing ring toward the pressing position.

7. The bearing unit according to claim 1, wherein the ring moving mechanism is a driving device that reciprocates the retainer ball-pressing ring between the pressing position and the standby position, using a driving force of an electric motor.

8. The bearing unit according to claim 7, further comprising a bearing mounting plate that holds the housing, wherein:
the ring moving mechanism further includes a driving force transmitting rod inserted in a mounting plate through-hole formed through the bearing mounting plate;
the driving device rotates the driving force transmitting rod about a rod axis, the rod axis being parallel to the unit center axis; and
the retainer ball-pressing ring is moved between the pressing position and the standby position by the rotation of the driving force transmitting rod.

9. The bearing unit according to claim 1, wherein:
the retainer ball-pressing ring further includes a ring main body that has a cylindrical shape extending in parallel with the unit center axis and is disposed along an outer surface of the ball retainer, and a ring top plate portion that extends inward from a tip end-sided end of the ring main body; and
when the pressing member is in contact with an inner end of the ring top plate portion and the retainer ball-pressing ring is at the standby position, the end of the base end of the pressing member is positioned closer to the base end than the end of the tip of the ball retainer.

10. The bearing unit according to claim 1, wherein:
the retainer ball-pressing ring further has a ring-shaped expanding portion that protrudes outward from a base end-sided end of a ring main body; and
the expanding portion is in contact with an inner side of the housing from the base end at the standby position.

11. The bearing unit according to claim 1, wherein the housing has a threaded-shaft protruding from the base end and a power supply connection terminal is formed at the threaded-shaft.

12. A support table, wherein the bearing unit according to claim 1 or 2 is disposed protruding from a bedplate at a plurality of positions on the bedplate.

13. A carrying equipment, comprising at least one of the bearing unit according to claim 1 and a support table wherein the at least one of the bearing unit is disposed protruding from a bedplate at a plurality of positions on the bedplate.

14. A turntable comprising:
a base member composed of at least one of the bearing unit according to claim 1 and a support table, wherein the at least one of the bearing unit is disposed protruding from a bedplate at a plurality of positions on the bedplate; and
a rotary table rotatably disposed on the base member.

15. A carrying equipment, comprising at least one of the bearing unit according to claim 2 and a support table, wherein the at least one of the bearing unit is disposed protruding from a bedplate at a plurality of positions on the bedplate.

16. A turntable comprising:
a base member composed of at least one of the bearing unit according to claim 2 and a support table, wherein the at least one of the bearing unit is disposed protruding from a bedplate at a plurality of positions on the bedplate; and
a rotary table rotatably disposed on the base member.

* * * * *